(12) United States Patent
Kang et al.

(10) Patent No.: US 12,046,562 B2
(45) Date of Patent: *Jul. 23, 2024

(54) SEMICONDUCTOR PACKAGE

(71) Applicant: Samsung Electronics Co., Ltd., Suwon-si (KR)

(72) Inventors: Myungsam Kang, Hwaseong-si (KR); Youngchan Ko, Seoul (KR); Jeongseok Kim, Cheonan-si (KR); Bongju Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/151,517

(22) Filed: Jan. 9, 2023

(65) Prior Publication Data

US 2023/0144454 A1 May 11, 2023

Related U.S. Application Data

(63) Continuation of application No. 17/195,823, filed on Mar. 9, 2021, now Pat. No. 11,562,966.

(30) Foreign Application Priority Data

Jul. 10, 2020 (KR) .................. 10-2020-0085232

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); (Continued)

(58) Field of Classification Search
CPC ............ H01L 23/5389; H01L 21/4853; H01L 21/4857; H01L 21/565; H01L 21/568; H01L 21/6835; H01L 23/3128; H01L 23/5383; H01L 23/5386; H01L 24/19; H01L 24/20; H01L 25/105; H01L 2221/68372; H01L 2224/214; H01L 2224/215; H01L 2225/1035; H01L 2225/1058

See application file for complete search history.

(56) References Cited

U.S. PATENT DOCUMENTS 9,420,703 B2 8/2016 Hayashi et al.
9,627,368 B2 4/2017 Kim et al.
(Continued)

FOREIGN PATENT DOCUMENTS

KR 20140060435 A 5/2014

*Primary Examiner* — Fernando L Toledo
*Assistant Examiner* — Neil R Prasad
(74) *Attorney, Agent, or Firm* — Myers Bigel, P.A.

(57) ABSTRACT

A semiconductor package includes a first redistribution structure having a first surface in which a first pad and a second pad are embedded and including a first redistribution layer thereon, and a vertical connection structure including a land layer and a pillar layer. The land layer is embedded in the first surface of the first redistribution structure, and a width of an upper surface of the land layer is narrower than a width of a lower surface of the pillar layer.

20 Claims, 20 Drawing Sheets

(51) Int. Cl.
*H01L 21/56* (2006.01)
*H01L 21/683* (2006.01)
*H01L 23/00* (2006.01)
*H01L 23/31* (2006.01)
*H01L 25/10* (2006.01)

(52) U.S. Cl.
CPC .......... *H01L 23/5386* (2013.01); *H01L 24/19* (2013.01); *H01L 24/20* (2013.01); *H01L 25/105* (2013.01); H01L 2221/68372 (2013.01); H01L 2224/214 (2013.01); H01L 2224/215 (2013.01); H01L 2225/1035 (2013.01); H01L 2225/1058 (2013.01)

(56) References Cited

U.S. PATENT DOCUMENTS

| | | |
|---|---|---|
| 9,806,040 B2 | 10/2017 | Liu et al. |
| 9,859,245 B1 | 1/2018 | Chen et al. |
| 10,276,382 B2 | 4/2019 | Hunt et al. |
| 11,562,966 B2 * | 1/2023 | Kang ................ H01L 21/6835 |
| 2011/0254156 A1 | 10/2011 | Lin |
| 2014/0131856 A1 | 5/2014 | Do et al. |
| 2018/0122780 A1 | 5/2018 | Chen et al. |
| 2019/0295944 A1 | 9/2019 | Kwon et al. |
| 2019/0348381 A1 | 11/2019 | Chen et al. |
| 2020/0091215 A1 | 3/2020 | Jang et al. |

\* cited by examiner

II-II'

SEMICONDUCTOR PACKAGE

CROSS-REFERENCE TO RELATED APPLICATION(S)

This application is a continuation of and claims priority to U.S. patent application Ser. No. 17/195,823 filed on Mar. 9, 2021, which claims benefit of priority to Korean Patent Application No. 10-2020-0085232 filed on Jul. 10, 2020, the disclosures of which are incorporated herein by reference in their entirety.

FIELD

The present inventive concept relates to a semiconductor package.

BACKGROUND

According to trends for miniaturization and high performance of electronic products, it may be desirable to reduce a mounting area of a semiconductor package. Accordingly, a package-on-package (POP) structure in which a plurality of packages are coupled has been proposed. In order to implement the package-on-package structure, a semiconductor package may include a metal pillar passing through an encapsulant.

SUMMARY

An aspect of the present inventive concept is to provide a semiconductor package having a reduced or minimized thickness.

According to an aspect of the present inventive concept, a semiconductor package includes a first redistribution structure having a first surface comprising a first pad and a second pad therein, and a second surface opposite the first surface and comprising a first redistribution layer electrically connected to the first pad and the second pad; a vertical connection structure comprising a land layer on the first pad, and a pillar layer on the land layer and electrically connected to the first redistribution layer; a semiconductor chip on the first surface of the first redistribution structure and comprising a connection electrode electrically connected to the second pad; a first encapsulant on at least a portion of the vertical connection structure and comprising a cavity sized to accept the semiconductor chip; a second encapsulant on the first encapsulant and in the cavity; and a first connection bump on the second surface of the first redistribution structure and electrically connected to the first redistribution layer, wherein the land layer is in the first surface of the first redistribution structure, and a width of an upper surface of the land layer is narrower than a width of a lower surface of the pillar layer thereon.

According to an aspect of the present inventive concept, a semiconductor package includes a redistribution structure comprising an insulating layer, a redistribution layer on the insulating layer, and first and second pads in a surface of the insulating layer that is opposite the redistribution layer, wherein the first and second pads are electrically connected to the redistribution layer; a semiconductor chip on the redistribution structure and including a connection electrode electrically connected to the second pad; a vertical connection structure on the redistribution structure, adjacent the semiconductor chip, and electrically connected to the first pad; and an encapsulant on the semiconductor chip and the vertical connection structure, wherein the vertical connection structure comprises a land layer in the insulating layer and contacting the first pad, and a pillar layer on the land layer, and wherein a width of the pillar layer increases in a direction toward the land layer.

According to an aspect of the present inventive concept, a semiconductor package includes a first redistribution structure comprising a plurality of pads in an upper surface of the first redistribution structure and a first redistribution layer electrically connected to the plurality of pads; a vertical connection structure on the upper surface of the first redistribution structure and electrically connected to the first redistribution layer; a core structure on the upper surface of the first redistribution structure and electrically connected to the first redistribution layer; a semiconductor chip on the upper surface of the first redistribution structure and including connection electrodes; an encapsulant on at least a portion of the vertical connection structure, at least a portion of the core structure, and at least a portion of the semiconductor chip; and a second redistribution structure on the encapsulant and comprising a second redistribution layer electrically connected to the vertical connection structure, wherein the plurality of pads include first pads that are electrically connected to the vertical connection structure, second pads that are electrically connected to the core structure, and third pads that are electrically connected to the connection electrodes of the semiconductor chip, wherein the vertical connection structure and the core structure include first pillar layers and second pillar layers on the first pads and the second pads, respectively, wherein the first and second pillar layers are separated by the encapsulant, and first and second land layers between the first and second pillar layers and the first and second pads, respectively, wherein upper surfaces of the third pads have a step difference from the upper surface of the first redistribution structure, respectively, and wherein respective thicknesses of the first and second land layers are substantially equal to a height of the step difference.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
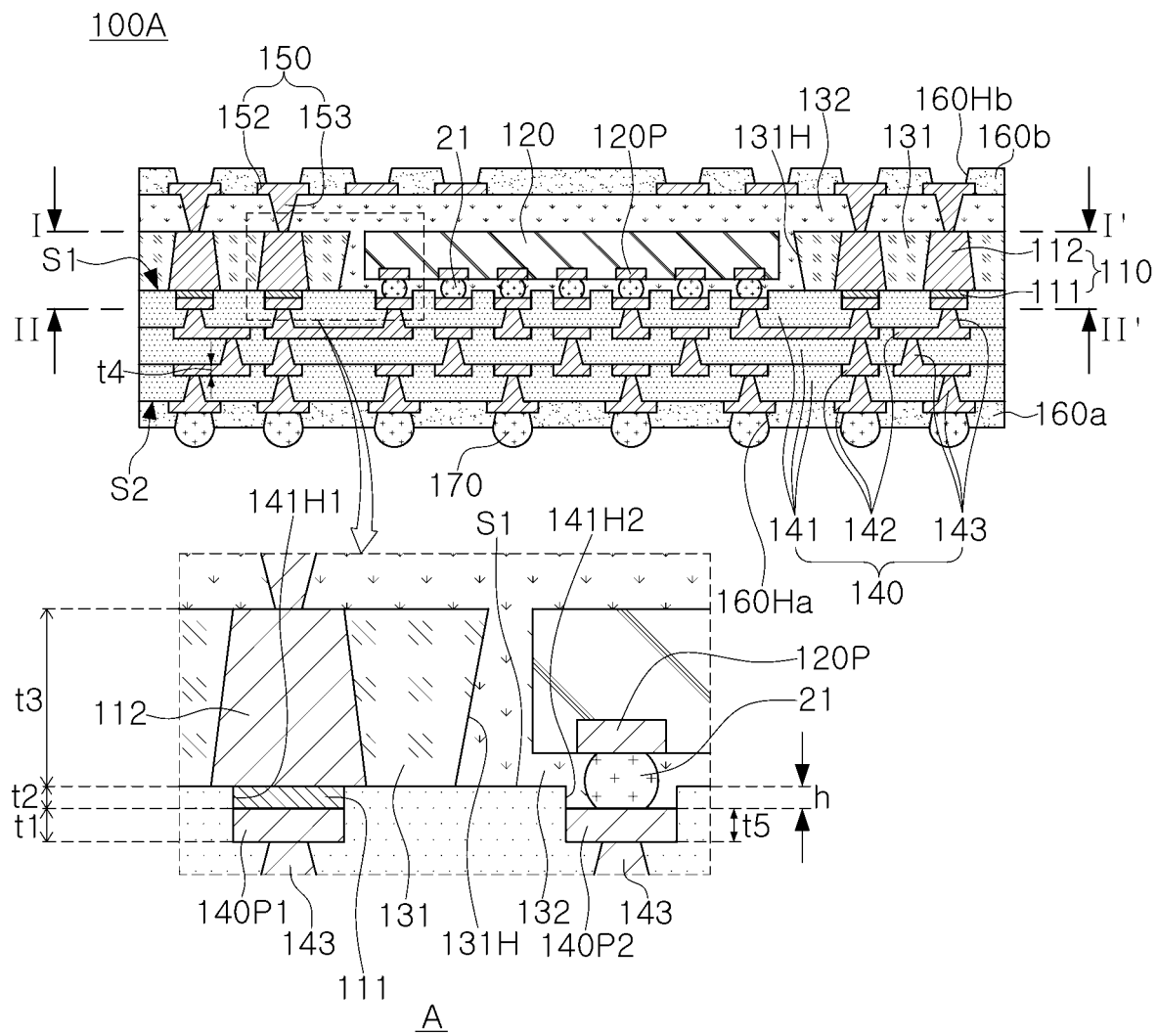
FIG. 1 is a cross-sectional view illustrating a semiconductor package according to an embodiment of the present inventive concept.
Figure 2A:
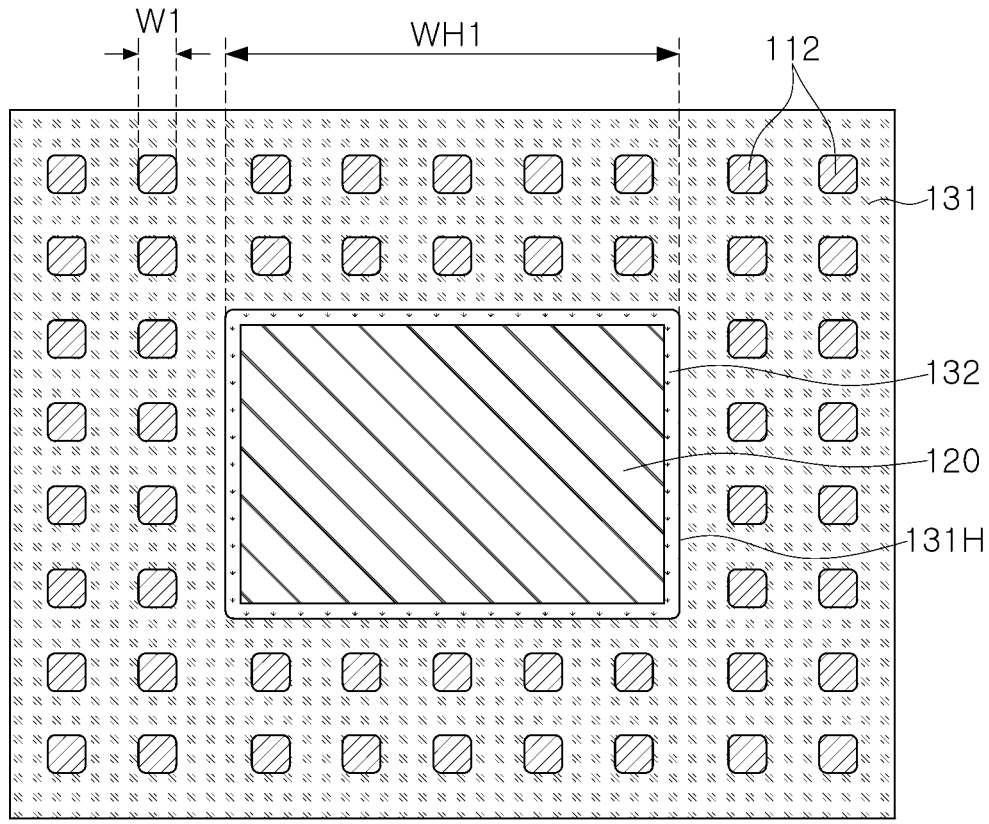
FIGS. 2A and 2B are plan views taken along line I-I' and line II-IF of the semiconductor package of FIG. 1, respectively.
Figure 2B:
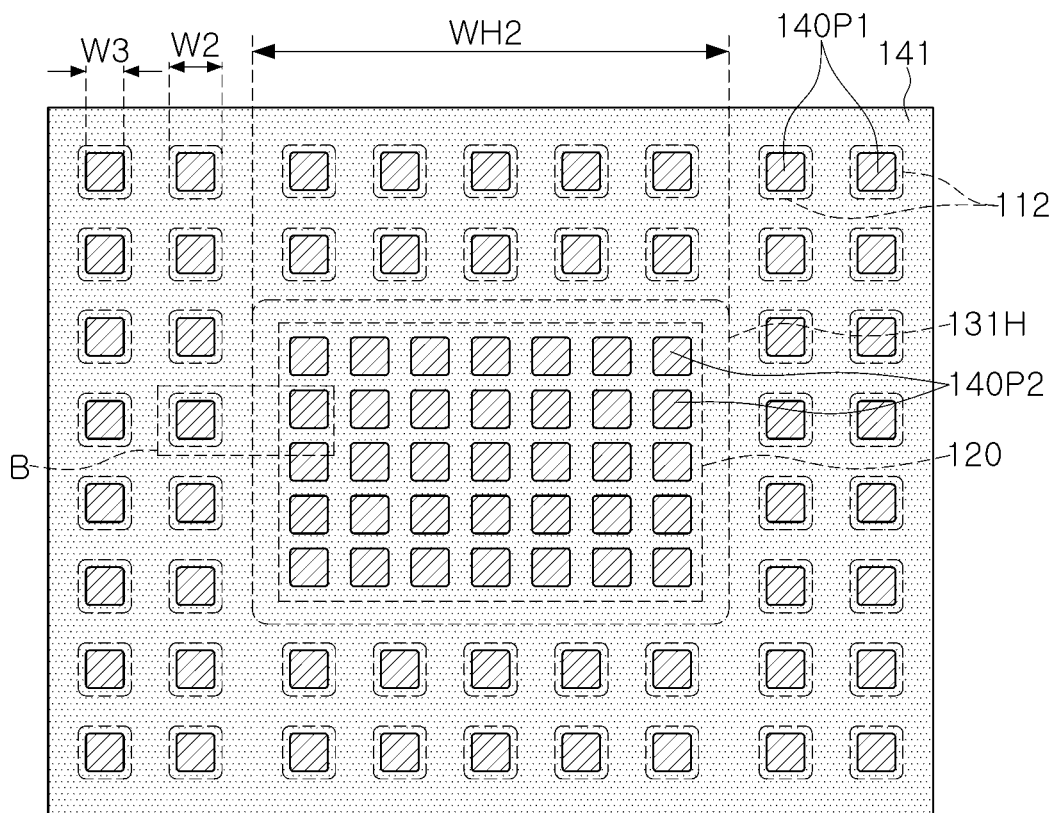

FIG. 1 is a cross-sectional view illustrating a semiconductor package 100A according to an embodiment of the present inventive concept, and FIGS. 2A and 2B are plan views taken along line I-I' and line II-IF of the semiconductor package 100A of FIG. 1, respectively.

Referring to FIGS. 1, 2A, and 2B, a semiconductor package 100A may include a vertical connection structure 110, a semiconductor chip 120, first and second encapsulants 131 and 132, a first redistribution structure 140, and a second redistribution structure 150. In addition, the semiconductor package 100A may further include passivation layers 160a and 160b and a first connection bump 170. The terms first, second, third, etc. may be used herein merely to distinguish one element from another.

The vertical connection structure 110 may be disposed on a first surface S1 of the first redistribution structure 140, and may be electrically connected to a first redistribution layer 142. The vertical connection structure 110 may be disposed on the first surface S1 to surround the semiconductor chip 120. Elements, regions, or layers referred to herein as being "on" or "contacting" one another may be directly on or contacting one another (i.e., without intervening elements, regions, or layers), or intervening elements, regions, or layers may be present. The vertical connection structure 110 may provide an electrical connection path for connecting upper and lower components of the semiconductor package 100A. A package-on-package structure in which other packages are coupled to an upper portion of the semiconductor package 100A may be implemented by the vertical connection structure 110.

The vertical connection structure 110 may include a land layer 111 disposed on a first pad 140P1 of the first redistribution structure 140, and a pillar layer 112 disposed on the land layer 111. The land layer 111 and the pillar layer 112 may include metal materials, for example, copper (Cu), aluminum (Al), silver (Ag), tin (Sn), gold (Au), nickel (Ni), lead (Pb), titanium (Ti), alloys thereof, or the like.

The land layer 111 may be embedded in or may otherwise extend in the first surface S1 of the first redistribution structure 140. The land layer 111 may be embedded in a surface (e.g., the first surface S1) of an insulating layer 141 of the first redistribution structure 140, opposing a surface on which the first redistribution layer 142 is disposed. The land layer 111 may be in contact with the first pad 140P1 of the first redistribution structure 140. An upper surface of the land layer 111 may be exposed from or by the insulating layer 141. The land layer 111 may be in contact with a lower surface of the pillar layer 112. A width of the upper surface of the land layer 111 may be narrower than a width of the lower surface of the pillar layer 112. The upper surface of the land layer 111 may be substantially coplanar with the first surface S1 of the first redistribution structure 140.

A thickness t2 of the land layer 111 may be less than a thickness t1 of the first pad 140P1, and may be less than a thickness t3 of the pillar layer 112. Thickness directions may be generally perpendicular to width directions as described herein unless otherwise noted. The land layer 111 may have a vertical cross-sectional shape in which a lateral surface of the land layer 111 is tapered to increase in width, as the land layer 111 approaches the pillar layer 112. The lateral surface of the land layer 111 may not be continuously connected to a lateral surface of the first pad 140P1. The land layer 111 may include a material different from the pillar layer 112 and the first pad 140P1. For example, the land layer 111 may be a metal layer including nickel (Ni) or titanium (Ti), and the pillar layer 112 and/or the first pad 140P1 may be a metal layer including copper (Cu). The land layer 111 may serve as an etching barrier in an etching process of forming the first pad 140P1 and the pillar layer 112.

The pillar layer 112 may be disposed on the land layer 111. The pillar layer 112 may occupy a majority or most of a height of the vertical connection structure 110, and may provide an electrical connection path passing through a first encapsulant 131. The pillar layer 112 may have a vertical cross-sectional shape in which a lateral surface of the pillar layer 112 is tapered to increase in width, as the pillar layer 112 approaches the land layer 111. For example, in a plan view, a width of an upper surface of the pillar layer 112 ("W1" in FIG. 2A) may be narrower than a width of the lower surface of the pillar layer 112 ("W2" in FIG. 2B). A maximum width of the pillar layer 112 ("W2" in FIG. 2B) may be greater than a maximum width of the first pad 140P1 ("W3" in FIG. 2B). At least a portion of the lower surface of the pillar layer 112 may be in contact with an upper surface of the insulating layer 141 of the first redistribution structure 140. The upper surface of the pillar layer 112 may be substantially coplanar with an upper surface of the first encapsulant 131.

A thickness of the pillar layer 112 may be greater than a thickness of the land layer 111, and may be greater than a thickness of the first pad 140P1, and the thickness of the first pad 140P1 may be greater than the thickness of the land layer 111. For example, the thickness t3 of the pillar layer 112 may be about 100 μm or more and about 200 μm or less, the thickness t2 of the land layer 111 may be about 1 μm or more and about 2 μm or less, and the thickness t1 of the first pad 140P1 may be about 5 μm or more and about 10 μm or less. Further, the thickness t1 of the first pad 140P1 may be substantially similar to a thickness t4 of the first redistribution layer 142, but is not limited thereto. The thickness t1 of the first pad 140P1 may be greater or less than the thickness t4 of the first redistribution layer 142. Since the first pad 140P1, the land layer 111, and the pillar layer 112 may be formed by an etching process, they may have a vertical cross-sectional shape in which lateral surfaces thereof are concave. The thickness t5 of a second pad 140P2 may be substantially equal to the thickness t1 of the first pad 140P1, but is not limited thereto.

The vertical connection structure 110 may be formed together with the first pad 140P1 of the first redistribution structure 140 by the same etching process. Therefore, a height or thickness of the pillar layer 112 protruding from the first surface S1 of the first redistribution structure 140 may be designed or otherwise configured to be substantially equal to a height of a semiconductor chip 120 mounted on the first surface S1 of the first redistribution structure 140. In addition, the pillar layer 112 may be provided as a plurality of pillar layers 112, in which one metal plate may be etched to have a uniform height on the first redistribution structure 140. Therefore, flatness or planarity of the encapsulants 131 and 132 may be improved, and a second redistribution structure 150 may be easily formed.

Figure 3A:
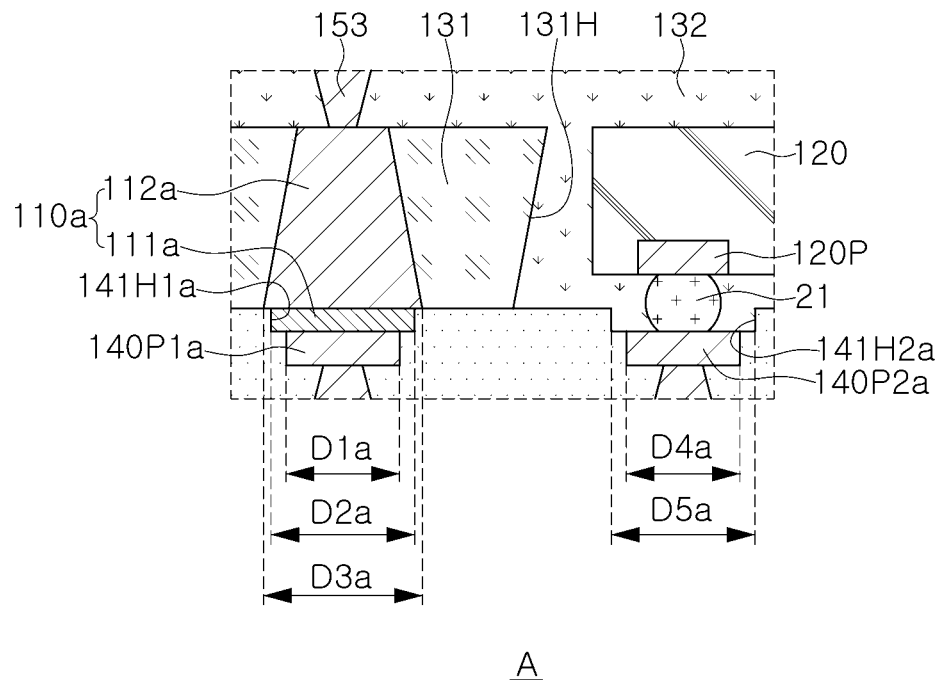
FIGS. 3A to 3C are partially enlarged cross-sectional views illustrating a modified example of portion "A" of FIG. 1.
Figure 3B:
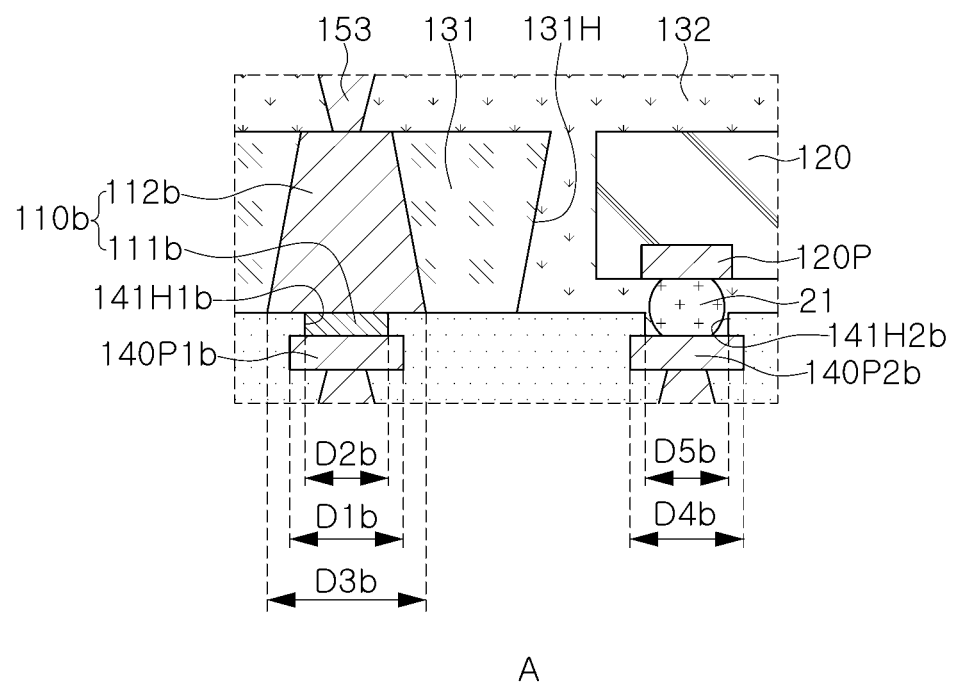
Figure 3C:
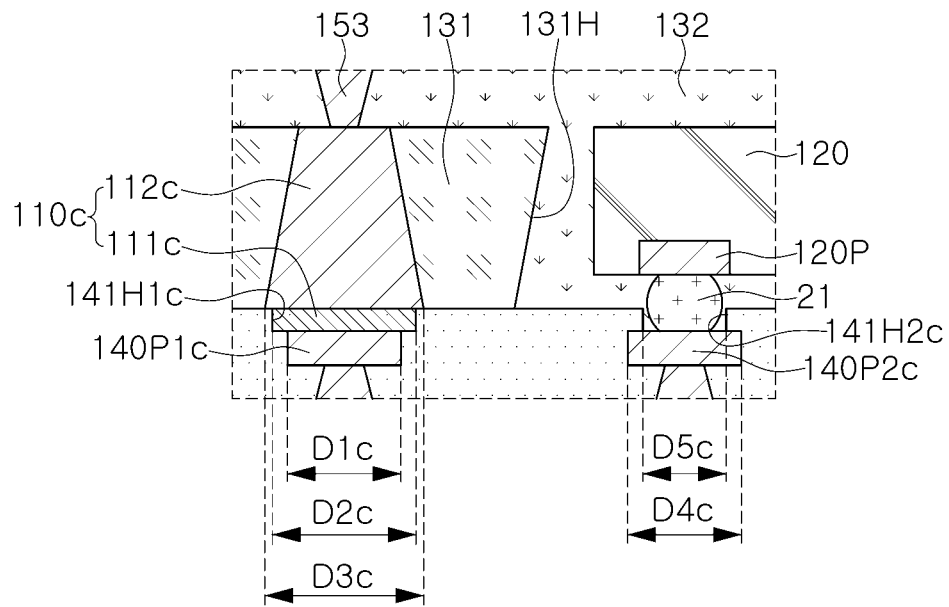

Hereinafter, a modified example of the vertical connection structure 110 will be described with reference to FIGS. 3A to 3C. FIGS. 3A to 3C are partially enlarged cross-sectional views illustrating a modified example of portion "A" of FIG. 1.

Referring to FIG. 3A, in a modified example, a width D2$a$ of a land layer 111$a$ may be narrower than a width D3$a$ of a pillar layer 112$a$, and may be greater than a width D1$a$ of a first pad 140P1$a$. A width D4$a$ of a second pad 140P2$a$ may be narrower than a width D5$a$ of a second opening 141H2$a$. The width D1$a$ of the first pad 140P1$a$ may be substantially equal to the width D4$a$ of the second pad 140P2$a$. Since the pillar layer 112$a$, the land layer 111$a$, the first pad 140P1$a$, and the second pad 140P2$a$ are formed by an etching process, lateral surfaces thereof may have a rounded shape, respectively. In addition, since the pillar layer 112$a$ has a different etching direction from the land layer 111$a$, the first pad 140P1$a$, and the second pad 140P2$a$, the pillar layer 112$a$ may have a vertical cross-sectional shape tapered in a direction away from or opposing the land layer 111$a$, the first pad 140P1$a$, and the second pad 140P2$a$.

Referring to FIG. 3B, in a modified example, a width D2$b$ of a land layer 111$b$ may be narrower than a width D3$b$ of a pillar layer 112$b$, and may be narrower than a width D1$b$ of a first pad 140P1$b$. A width D4$b$ of a second pad 140P2$b$ may be greater than a width D5$b$ of a second opening 141H2$b$. The width D1$b$ of the first pad 140P1$b$ may be substantially equal to the width D4$b$ of the second pad 140P2$b$. Since the pillar layer 112$b$, the land layer 111$b$, the first pad 140P1$b$, and the second pad 140P2$b$ are formed by an etching process, lateral surfaces thereof may have a rounded shape, respectively. In addition, since the pillar layer 112$b$ has a different etching direction from the land layer 111$b$, the first pad 140P1$b$, and the second pad 140P2$b$, the pillar layer 112$b$ may have a vertical cross-sectional shape tapered in a direction away from or opposing the land layer 111$b$, the first pad 140P1$b$, and the second pad 140P2$b$.

Referring to FIG. 3C, in a modified example, a width D2$c$ of a land layer 111$c$ may be narrower than a width D3$c$ of a pillar layer 112$c$, and may be greater than a width D1$c$ of a first pad 140P1$c$. A width D4$c$ of a second pad 140P2$c$ may be greater than a width D5$c$ of a second opening 141H2$c$. The width D2$c$ of a first opening 141H1$c$ exposing the first pad 140P1$c$ may be different from the width D5$c$ of the second opening 141H2$c$ exposing the second pad 140P2$c$. Since the pillar layer 112$c$, the land layer 111$c$, the first pad 140P1$c$, and the second pad 140P2$c$ are formed by an etching process, lateral surfaces thereof may have a rounded shape, respectively. In addition, since the pillar layer 112$c$ has a different etching direction from the land layer 111$c$, the first pad 140P1$c$, and the second pad 140P2$c$, the pillar layer 112$c$ may have a vertical cross-sectional shape tapered in a direction away from or opposing the land layer 111$c$, the first pad 140P1$c$, and the second pad 140P2$c$.

Figure 4A:
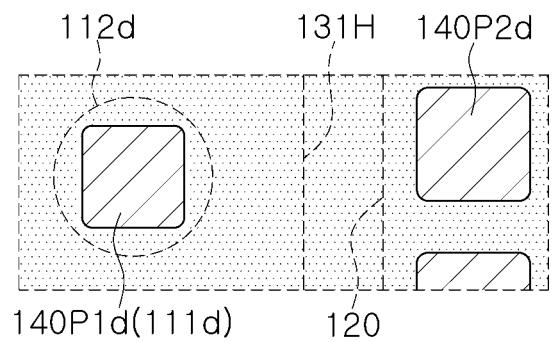
FIGS. 4A to 4C are partially enlarged cross-sectional views illustrating a modified example of portion "B" of FIG. 2B.
Figure 4B:
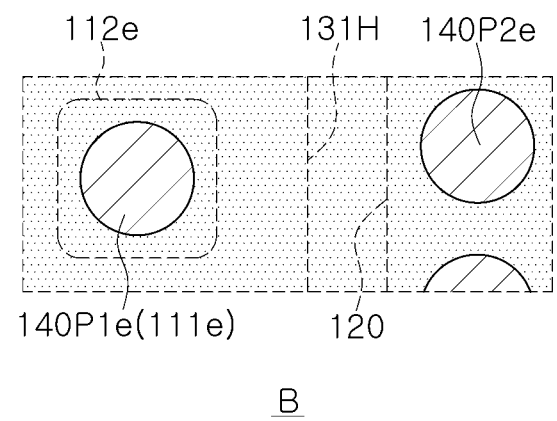
Figure 4C:
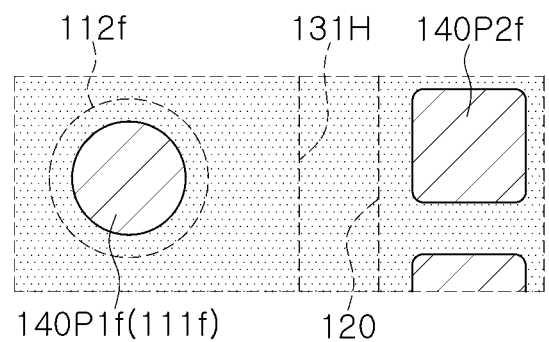

Hereinafter, another modified example of the vertical connection structure 110 will be described with reference to FIGS. 4A to 4C. FIGS. 4A to 4C are partially enlarged cross-sectional views illustrating a modified example of portion "B" of FIG. 2B.

Referring to FIG. 4A, in a modified example, a first pad 140P1$d$ and a second pad 140P2$d$ may have a rectangular planar shape, and vertices thereof may be rounded. Herein, a planar shape may refer to the shape of an element or region when viewed in plan view. A pillar layer 112$d$ may have a rectangular planar shape, or may have a circular or elliptical shape as shown. A land layer 111$d$ may be located between the first pad 140P1$d$ and the pillar layer 112$d$. The land layer 111$d$ may have the same planar shape as the first pad 140P1$d$, or the land layer 111$d$ may have the same planar shape as the pillar layer 112$d$.

Referring to FIG. 4B, in a modified example, a first pad 140P1$e$ may have a circular planar shape, unlike a pillar layer 112$e$. A second pad 140P2$e$ may have a circular planar shape similar to the first pad 140P1$e$. The pillar layer 112$e$ may have a rectangular planar shape, and vertices thereof may be rounded. A land layer 111$e$ may be located between the first pad 140P1$e$ and the pillar layer 112$e$. The land layer 111$e$ may have the same planar shape as the first pad 140P1$e$, or the land layer 111$e$ may have the same planar shape as the pillar layer 112$e$.

Referring to FIG. 4C, in a modified example, a first pad 140P1$f$ and a second pad 140P2$f$ may have different planar shapes. The first pad 140P1$f$ may have a circular planar shape. The second pad 140P2$f$ may have a rectangular planar shape, and vertices thereof may be rounded. A pillar layer 112$f$ may have a circular planar shape similar to the first pad 140P1$f$. A land layer 111$f$ may be located between the first pad 140P1$f$ and the pillar layer 112$f$, and may have the same planar shape as the first pad 140P1$f$.

The semiconductor chip 120 may be disposed on the first surface S1 of the first redistribution structure 140, and may be electrically connected to the first redistribution layer 142. The semiconductor chip 120 may include a connection electrode 120P electrically connected to the second pad 140P2 of the first redistribution structure 140. A lower surface of the semiconductor chip 120 may be spaced apart from the first surface S1 of the first redistribution structure 140. The connection electrode 120P may be electrically connected to the second pad 140P2 by a second connection bump 21 disposed between the lower surface of the semiconductor chip 120 and the first surface S1 of the first redistribution structure 140. In this case, a height or distance from the first surface S1 of the first redistribution structure 140 to an upper surface of the semiconductor chip 120 may be substantially equal to the thickness t3 of the pillar layer 112. The upper surface of the semiconductor chip 120 may be substantially coplanar with the upper surface of the pillar layer 112 and the upper surface of the first encapsulant 131.

The semiconductor chip 120 may be a bare integrated circuit (IC) in which a separate bump or wiring layer is not formed, but is not limited thereto, and may be a packaged type integrated circuit. The integrated circuit may be formed on the basis of an active wafer. The semiconductor chip 120 may include silicon (Si), germanium (Ge), or gallium arsenide (GaAs), and various types of integrated circuits may be formed. Integrated circuits may be processor chips such as central processors (e.g., CPU), graphics processors (e.g., GPU), field programmable gate arrays (FPGA), application processors (AP), digital signal processors, encryption processors, microprocessors, microcontrollers, or the like, but are not limited thereto, and may be logic chips such as analog-digital converters and application-specific ICs (ASICs), or memory chips such as volatile memory chips (e.g., DRAM), non-volatile memory chips (e.g., ROM and flash memory chips), or the like. The connection electrode 120P may electrically connect the semiconductor chip 120 to other components. The connection electrode 120P may include a metal material, for example, aluminum (Al), but is not limited thereto, and may include other types of conductive materials.

The encapsulants 131 and 132 may include a first encapsulant 131 encapsulating at least a portion of the vertical connection structure 110 and having a cavity 131H accommodating or sized to accept the semiconductor chip 120, and a second encapsulant 132 disposed on the first encapsulant 131 and filling the cavity 131H of the first encapsulant 131. The cavity 131H may have a lateral surface tapered to increase in width, as the cavity approaches the first surface S1 of the first redistribution structure 140. For example, the cavity 131H may have an upper width WH1 narrower than a lower width WH2. The first encapsulant 131 may cover the lateral surface of the pillar layer 112. The second encapsulant 132 may cover an upper surface of the pillar layer 112 and upper and lateral surfaces of the semiconductor chip 120. The encapsulants 131 and 132 may include, for example, a thermosetting resin such as an epoxy resin, a thermoplastic resin such as polyimide, or a prepreg including an inorganic filler or/and a glass fiber, Ajinomoto build-up film (ABF), FR-4, bismaleimide triazine (BT), epoxy molding compound (EMC), or photoimageable dielectric (PID). The first encapsulant 131 and the second encapsulant 132 may include materials of the same or different types. For example, the first encapsulant 131 may include a film-type resin, and the second encapsulant 132 may include a PID. For example, both the first encapsulant 131 and the second encapsulant 132 may include ABF.

The first redistribution structure 140 may have a first surface S1 in which a first pad 140P1 and a second pad 140P2 are embedded, and a second surface S2 opposing the first surface S2, and may include an insulating layer 141, a first redistribution layer 142 disposed on the insulating layer 141, and a first redistribution via 143 passing through the insulating layer 141 to connect the first redistribution layer 142 to the first pad 140P1 and the second pad 140P2. The first redistribution layer 142 may be electrically connected to the first pad 140P1 and the second pad 140P2. The first pad 140P1 and the second pad 140P2 may be embedded in a surface of the insulating layer 141 that is opposing or opposite a surface on which the first redistribution layer 142 is disposed. The first redistribution structure 140 may redistribute a connection electrode 120P of the semiconductor chip 120, and may include fewer or more insulating layers 141, fewer or more first redistribution layers 142, and fewer or more first redistribution vias 143, as compared to those illustrated in the drawings.

The first pad 140P1 and the second pad 140P2 may be formed by an etching process similar to the vertical connection structure 110. The first pad 140P1 and the second pad 140P2 may include the same metal material as the pillar layer 112. The thickness t1 of the first pad 140P1 and the second pad 140P2 may be greater than the thickness t2 of the land layer 111 of the vertical connection structure 110. The first pad 140P1 and the second pad 140P2 may be disposed on a level, lower than the first surface S1 of the first redistribution structure 140. Therefore, a gap between the first surface S1 of the first redistribution structure 140 and the vertical connection structure 110 and the semiconductor chip 120, mounted on the first redistribution structure 140, may be reduced or minimized.

The insulating layer 141 may have a first opening 141H1 and a second opening 141H2, exposing the first pad 140P1 and the second pad 140P2, respectively. The upper surface of the first pad 140P1 and the upper surface of the second pad 140P2 may have a step difference h from the first surface S1 of the first redistribution structure 140. The thickness t2 of the land layer 111 may be substantially equal to a height of the step difference h. The land layer 111 may be located in the first opening 141H1. The insulating layer 141 may be in contact with at least a portion of the lower surface of the pillar layer 112.

The insulating layer 141 may include an insulating material. For example, the insulating layer 141 may include a photosensitive insulating material such as PID. In this case, a fine pitch may be implemented by a photolithography process, to effectively redistribute the connection electrode 120P of the semiconductor chip 120. The insulating material included in the insulating layer 141 is not limited thereto, and may include other types of insulating material. The insulating layer 141 may include the same insulating material as the encapsulants 131 and 132, or may include a different type of insulating material. The insulating layer 141 may be provided as a plurality of insulating layers 141 disposed on different levels. An uppermost insulating layer 141 among the plurality of insulating layers 141 may cover the lower surface of the land layer 111.

The first redistribution layer 142 may be formed on a surface that is opposing or opposite a surface of the insulating layer 141 on which the first pad 140P1 and the second pad 140P2 are embedded. The first redistribution layer 142 may include a metal material such as copper (Cu), aluminum (Al), silver (Ag), tin (Sn), gold (Au), nickel (Ni), lead (Pb), titanium (Ti), alloys thereof, or the like. The first redistribution layer 142 may perform various functions according to design. For example, the first redistribution layer 142 may include a ground (GND) pattern, a power (PWR) pattern, and a signal (S) pattern. The signal S pattern may transmit various signals, such as data signals, excluding the ground (GND) pattern and the power (PWR) pattern. The thickness t4 of the first redistribution layer 142 may be substantially similar to the thickness t1 of the first pad 140P1 and the thickness t5 of the second pad 140P2, but is not limited thereto. The thickness t4 of the first redistribution layer 142 may be greater or less than the thickness t1 of the first pad 140P1 and the thickness t5 of the second pad 140P2.

The first redistribution via 143 may pass through a portion of the insulating layer 141 contacting a lower surface of the first pad 140P1 and a lower surface of the second pad 140P2, to physically or/and electrically connect the first redistribution layer 142 to the first pad 140P1 and the second pad 140P2. The first redistribution via 143 may electrically connect the first pad 140P1 and the second pad 140P2 to at least one of the signal pattern or the power pattern of the first redistribution layer 142. The first redistribution via 143 may be a metal material, for example, copper (Cu), aluminum (Al), silver (Ag), tin (Sn), gold (Au), nickel (Ni), lead (Pb), titanium (Ti), alloys thereof, or the like. The first redistribution via 143 may be a filled via completely filled with a metal material, or a conformal via in which a metal material is disposed along a wall surface of a via hole. The first redistribution via 143 may have a tapered lateral surface, an hourglass shape, or a cylindrical shape. The first redistribution via 143 may be integrated with the first redistribution layer 142, but is not limited thereto.

The second redistribution structure 150 may include a second redistribution layer 152 disposed on the encapsulants 131 and 132 and electrically connected to the vertical connection structure 110, and a second redistribution via 153 passing through at least a portion of the encapsulant 132 covering an upper surface of the vertical connection structure 110 and connecting the second redistribution layer 152 and the vertical connection structure 110.

At least a portion of the second redistribution layer 152 may be exposed from an upper portion of the semiconductor package 100A, and may be physically and electrically coupled to other electronic components provided from an external source of the semiconductor package 100A. The second redistribution layer 152 may include a metal material such as copper (Cu), aluminum (Al), silver (Ag), tin (Sn), gold (Au), nickel (Ni), lead (Pb), titanium (Ti), alloys thereof, or the like.

The second redistribution via 153 may electrically connect the second redistribution layer 152 to the vertical connection conductor or structure 110. The second redistribution via 153 may include a metal material similar to the second redistribution layer 152. The second redistribution via 153 may be a filled via or a conformal via. The second redistribution via 153 may have a shape similar to the first redistribution via 143.

The passivation layers 160a and 160b may include a first passivation layer 160a disposed on the second surface S2 of the first redistribution structure 140, and a second passivation layer 160b disposed on the second redistribution structure 150. The first and second passivation layers 160a and 160b may have openings 160Ha and 160Hb, respectively, exposing portions of the first and second redistribution layers 142 and 152. The first and second passivation layers 160a and 160b may include an insulating material, for example, ABF, but is not limited thereto, and may include other types of insulating materials.

The first connection bump 170 may be disposed on the second surface S2 of the first redistribution structure 140, and may be electrically connected to the first redistribution layer 142 exposed through the opening 160Ha of the first passivation layer 160a. The first connection bump 170 may physically and/or electrically connect the semiconductor package 100A to an external source or device. The first connection bump 170 may include a low melting point metal, for example, tin (Sn) or an alloy (Sn—Ag—Cu) containing tin (Sn). The first connection bump 170 may be a land, a ball, or a pin. The first connection bump 170 may include a copper pillar or solder. At least one of the first connection bumps 170 may be disposed in a fan-out region. The fan-out region refers to a region that does not overlap the semiconductor chip 120 in a direction that is perpendicular to the first surface S1 or the second surface S2 of the first redistribution structure 140.

FIGS. 5A to 5K are cross-sectional views schematically illustrating a method of manufacturing the semiconductor package 100A of FIG. 1.

Figure 5A:
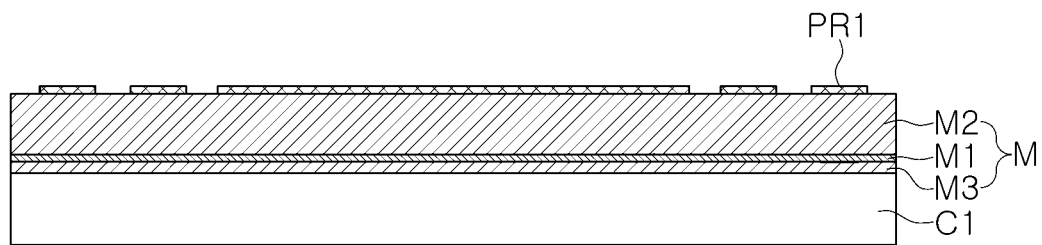
FIGS. 5A to 5K are cross-sectional views schematically illustrating a method of manufacturing the semiconductor package of FIG. 1.

Referring to FIG. 5A, first, a metal plate M including a first metal layer M3, an etching barrier layer M1 on the first metal layer M3, and a second metal layer M2 on the etching barrier layer M1, may be attached to a first carrier C1. A thickness of the second metal layer M2 may be about 100 μm or more and about 200 μm or less, a thickness of the etching barrier layer M1 may be about 1 μm or more and about 2 μm or less, and a thickness of the first metal layer M3 may be about 5 μm or more and about 10 μm or less. A first etching resist PR1, which has been patterned, may be disposed on an upper surface of the second metal layer M2. As the first etching resist PR1, for example, a photo resist may be used. The first metal layer M3, the second metal layer M2, and the etching barrier layer M1 may include a metal material. The etching barrier layer M1 may include a metal material, different from the first metal layer M3 and the second metal layer M2. For example, the first metal layer M3 and the second metal layer M2 may include copper, and the etching barrier layer M1 may include nickel or titanium.

Figure 5B:
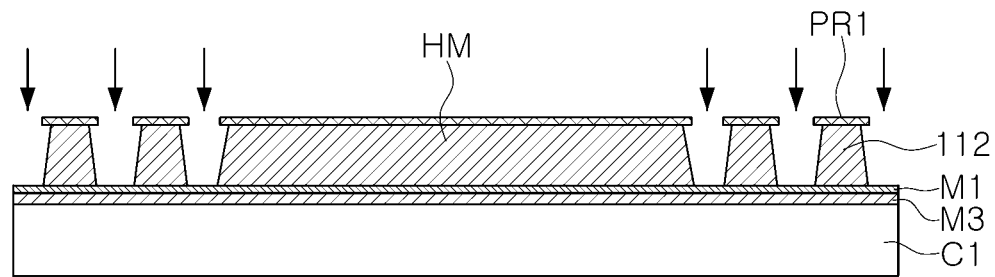

Referring to FIG. 5B, the second metal layer M2 on which the patterned first etching resist PR1 is disposed may be etched to form a pillar layer 112 and a cavity layer HM. The cavity layer HM may be removed by an etching process, described later, and may be used to form a cavity in which a semiconductor chip may be accommodated, i.e., the cavity may be sized to accept or fit the semiconductor chip therein. The second metal layer M2 may be etched by a copper chloride solution or an alkali solution. The etching barrier layer M1 may serve as an etch stop layer for an etching solution of the second metal layer M2. A lateral surface of the pillar layer 112 may be tapered to increase a horizontal width of the pillar layer 112, as the pillar layer 112 approaches the etching barrier layer M1. A width of an upper surface of the pillar layer 112 may be narrower than a width of the first etching resist PR1. The lateral surface of the pillar layer 112 may be concavely rounded with respect to a central axis of the pillar layer 112.

Figure 5C:
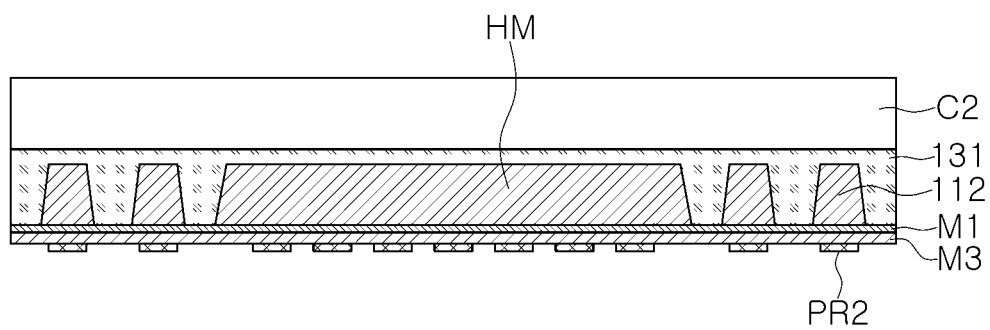

Referring to FIG. 5C, a first encapsulant 131 covering the pillar layer 112 and the cavity layer HM may be formed, and a side on which the first encapsulant 131 is formed may be attached to a second carrier C2. The first carrier C1 of FIG. 5B may be removed, and a second etching resist PR2, which has been patterned, may be disposed on a lower surface of the first metal layer M3. The second etching resist PR2 may be formed of the same material as the first etching resist PR1. The first encapsulant 131 may be ABF.

Figure 5D:
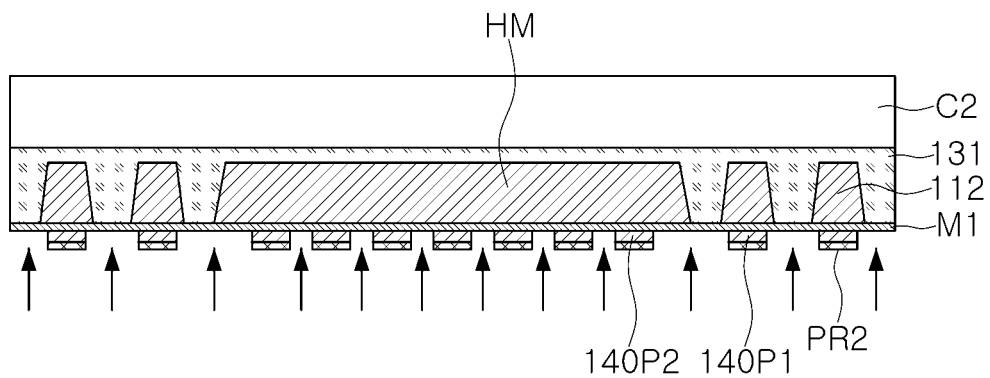

Referring to FIG. 5D, the first metal layer M3 on which the patterned second etching resist PR2 is disposed may be etched to form a first pad 140P1 and a second pad 140P2, respectively corresponding to the pillar layer 112 and the cavity layer HM. The first metal layer M3 may be etched by a copper chloride solution or an alkali solution. The first metal layer M3 may be etched by the same etching solution as the second metal layer M2. The etching barrier layer M1 may serve as an etch stop layer for an etching solution of the first metal layer M3. A lateral surface of the first pad 140P1 and a lateral surface of the second pad 140P2 may be tapered to increase horizontal widths thereof, as they approach the etching barrier layer M1. The lateral surface of the first pad 140P1 and the lateral surface of the second pad 140P2 may be concavely rounded with respect to central axes thereof.

Figure 5E:
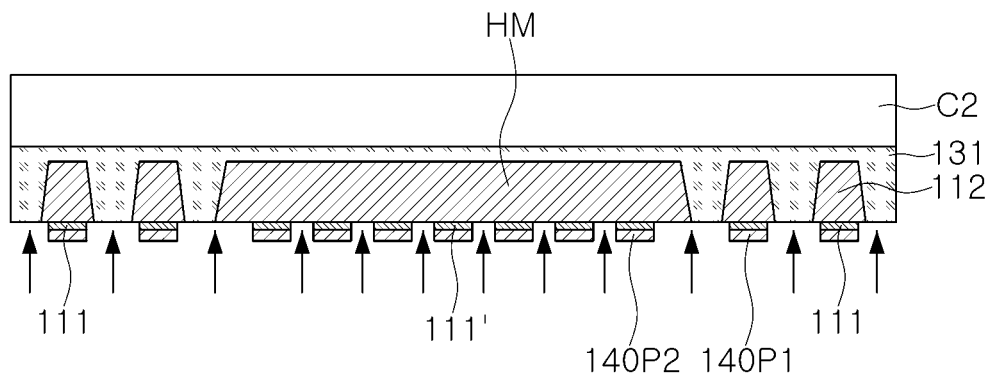

Referring to FIG. 5E, the second etching resist PR2 of FIG. 5D may be removed, and the etching barrier layer M1 may be etched, to form a land layer 111 disposed below the pillar layer 112 and a residual layer 111' disposed below the cavity layer HM. The etching barrier layer M1 may be etched by an etching solution, different from the first metal layer M3 and the second metal layer M2. The etching barrier layer M1 may be etched by a nitric acid (HNO$_3$) solution or a potassium hydroxide (KOH) solution. Remaining portions of the etching barrier layer M1, except for portions covered by the first and second pads 140P1 and 140P2, may be removed. Therefore, at least a portion of the lower surface of the pillar layer 112 may be exposed.

Figure 5F:
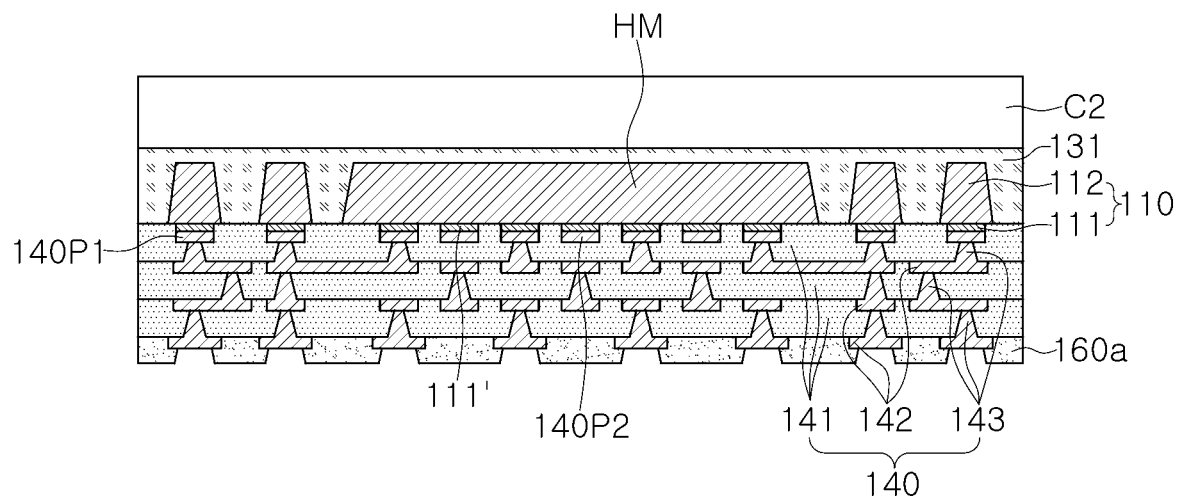

Referring to FIG. 5F, an insulating layer 141 covering the land layer 111, the residual layer 111', the first pad 140P1, and the second pad 140P2, a first redistribution layer 142 on the insulating layer 141, and a first redistribution via 143 passing through the insulating layer 141 may be formed. The insulating layer 141 may include a PID, and a via hole may be formed by a photolithography process. The first redistribution layer 142 and the first redistribution via 143 may be formed by a plating process. The photolithography process and the plating process may be repeated to form a first redistribution structure 140 including a plurality of insulating layers 141, a plurality of first redistribution layers 142, and a plurality of first redistribution vias 143. A first passivation layer 160a covering the first redistribution layer 142 may be formed below the first redistribution structure 140.

Figure 5G:
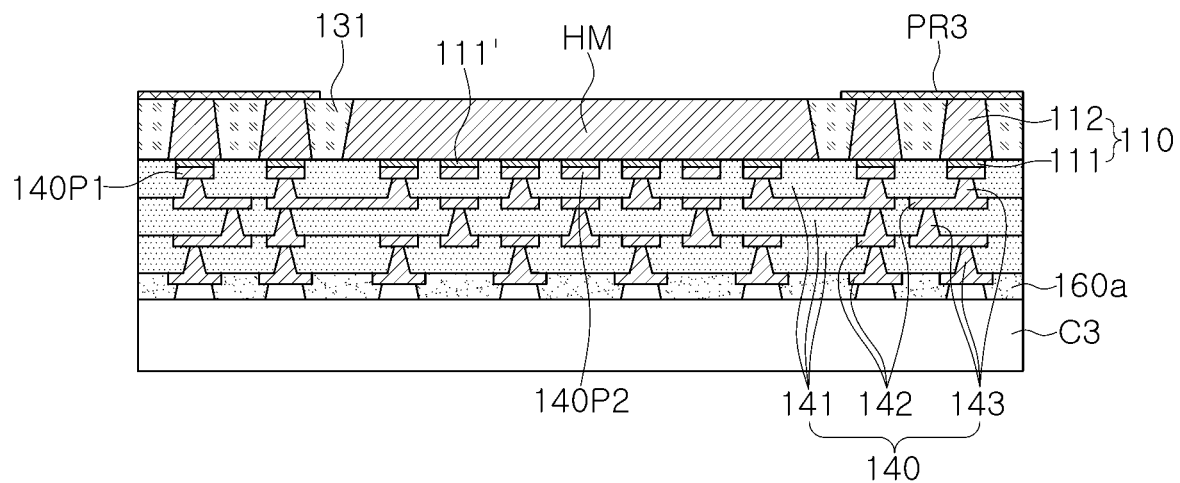

Referring to FIG. 5G, the second carrier C2 of FIG. 5F may be removed and the first encapsulant 131 may be polished, to expose the upper surface of the pillar layer 112 and an upper surface of the cavity layer HM. Thereafter, a third etching resist PR3 covering the upper surface of the pillar layer 112 may be disposed. A third carrier C3 may be disposed on a side in which the first redistribution structure 140 is formed. The third etching resist PR3 may be patterned to completely expose the cavity layer HM. The third etching resist PR3 may be formed of the same material as the first etching resist PR1.

Figure 5H:
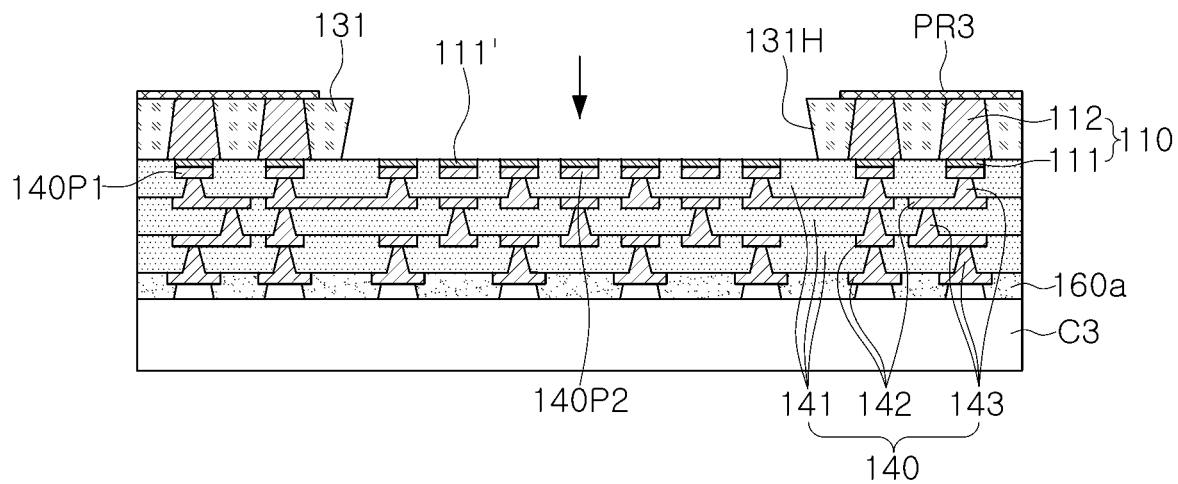

Referring to FIG. 5H, the cavity layer HM may be etched to form a cavity 131H. The cavity layer HM may be etched by a copper chloride solution or an alkali solution. The residual layer 111' may serve as an etch stop layer for an etching solution of the cavity layer HM. In a manner similar to the cavity layer HM, a lateral surface of the cavity 131H may be tapered to increase a horizontal width thereof, as the cavity 131H approaches the first pad 140P1 and the second pad 140P2. The cavity layer HM may be removed to expose the residual layer 111'.

Figure 5I:
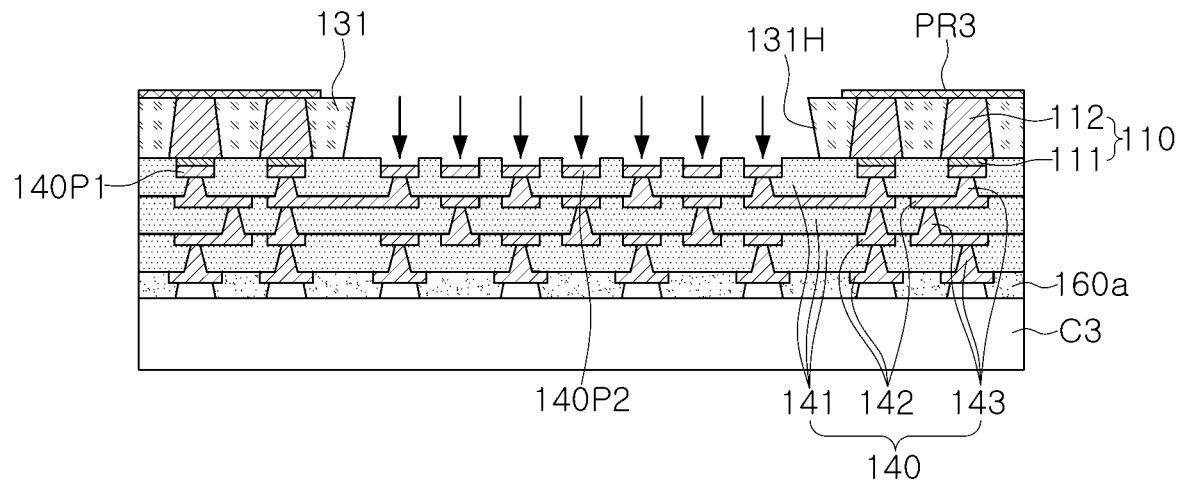

Referring to FIG. 5I, the residual layer 111' of FIG. 5H may be etched to expose the second pad 140P2. The residual layer 111' may be etched by an etching solution, different from the first and second metal layers M3 and M2. The residual layer 111' may be etched by a nitric acid solution or a potassium hydroxide solution. As the residual layer 111' may be removed to have a step difference between an upper surface of the second pad 140P2 and an upper surface of the insulating layer 141.

Figure 5J:
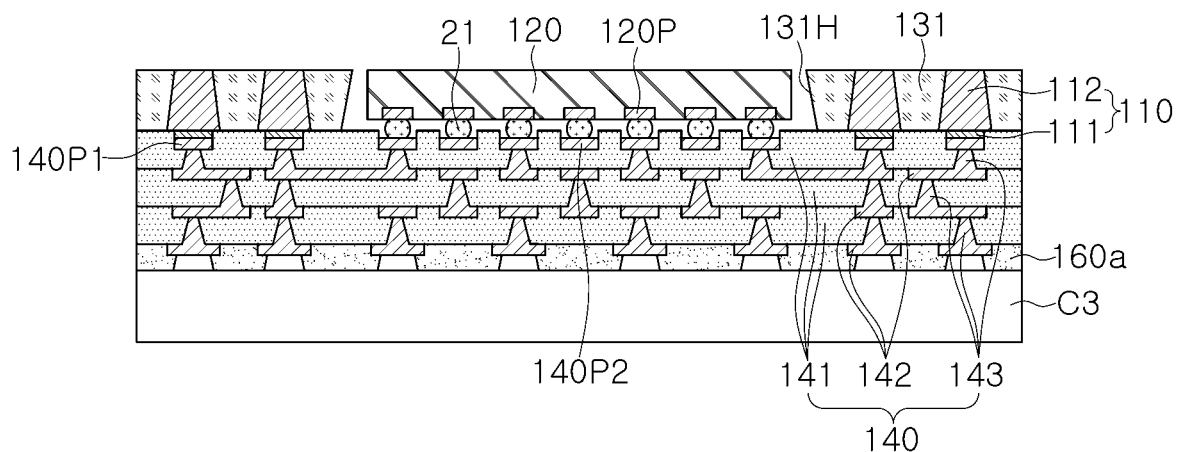

Referring to FIG. 5J, a semiconductor chip 120 may be disposed in the cavity 131H. The semiconductor chip 120 may be spaced apart from an upper surface of the first redistribution structure 140. A connection electrode 120P of the semiconductor chip 120 may be electrically connected to the second pad 140P2 through a connection bump 21. The connection bump 21 may be a solder ball. An upper surface of the semiconductor chip 120 may be substantially coplanar with an upper surface of the first encapsulant 131, and may be substantially coplanar with the upper surface of the pillar layer 112.

Figure 5K:
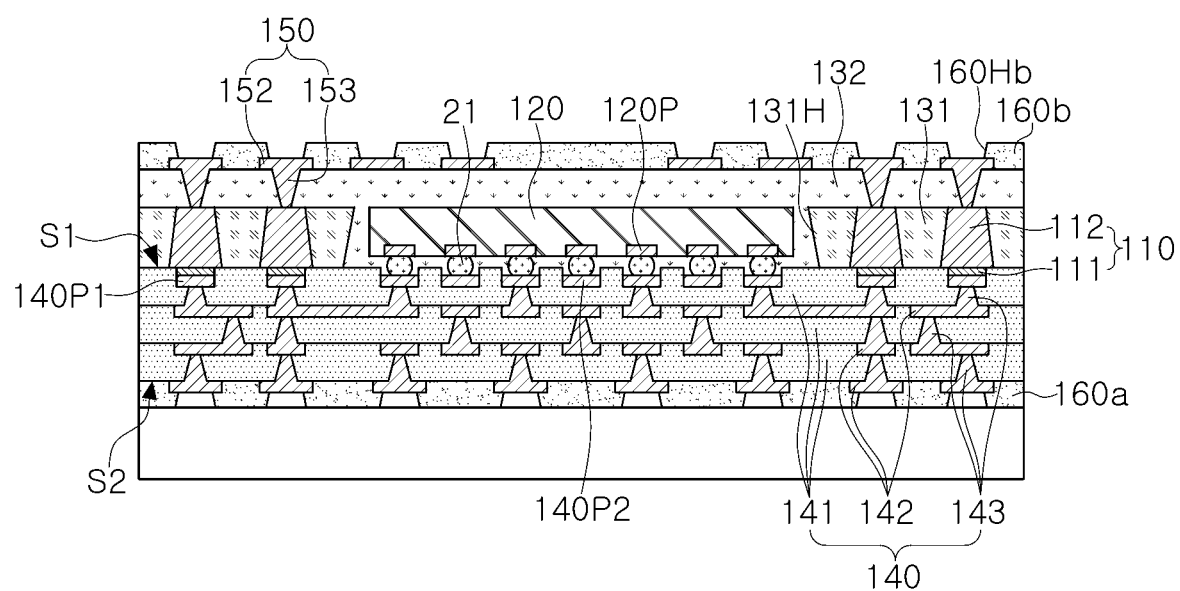

Referring to FIG. 5K, a second encapsulant 132 and a second redistribution structure 150 may be formed on the first encapsulant 131. The second encapsulant 132 may fill the cavity 131H, and may cover the upper surface of the semiconductor chip 120, the upper surface of the first encapsulant 131, and the upper surface of the pillar layer 112. The second encapsulant 132 may include a PID. A via hole passing through the second encapsulant 132 may be formed by a photolithography process. A second redistribution layer 152 and a second redistribution via 153 may be formed by a plating process. A second passivation layer 160b covering the second redistribution layer 152 may be formed.

The upper surfaces of the first and second pads 140P1 and 140P2 may be located on a lower level than the first surface S1 of the first redistribution structure 140. The land layer 111 and the pillar layer 112 may be sequentially stacked on the upper surface of the first pad 140P1. A height of the pillar layer 112 may be substantially equal to a height from the first surface S1 to the upper surface of the semiconductor chip 120. Therefore, a gap between the first redistribution structure 140 and a vertical connection structure 110 and the semiconductor chip 120 may be reduced or minimized.

Figure 6:
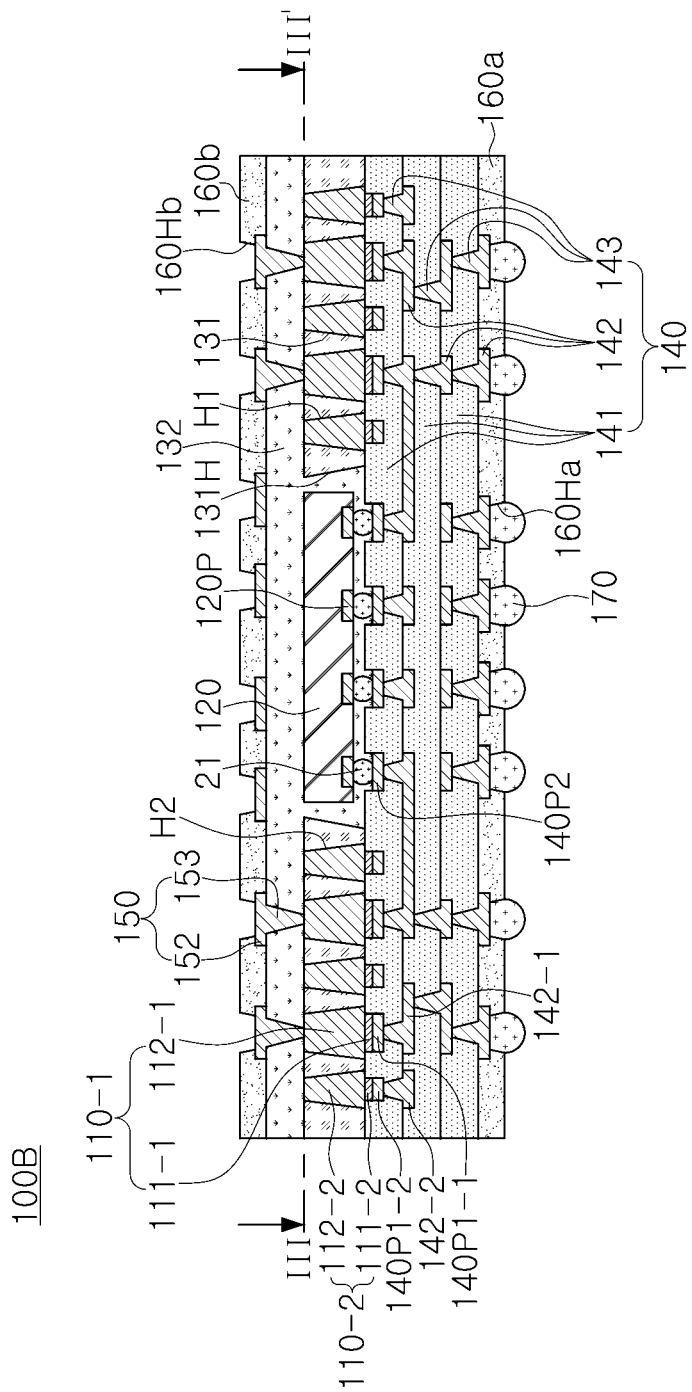
FIG. 6 is a cross-sectional view illustrating a semiconductor package according to an embodiment of the present inventive concept.
Figure 7:
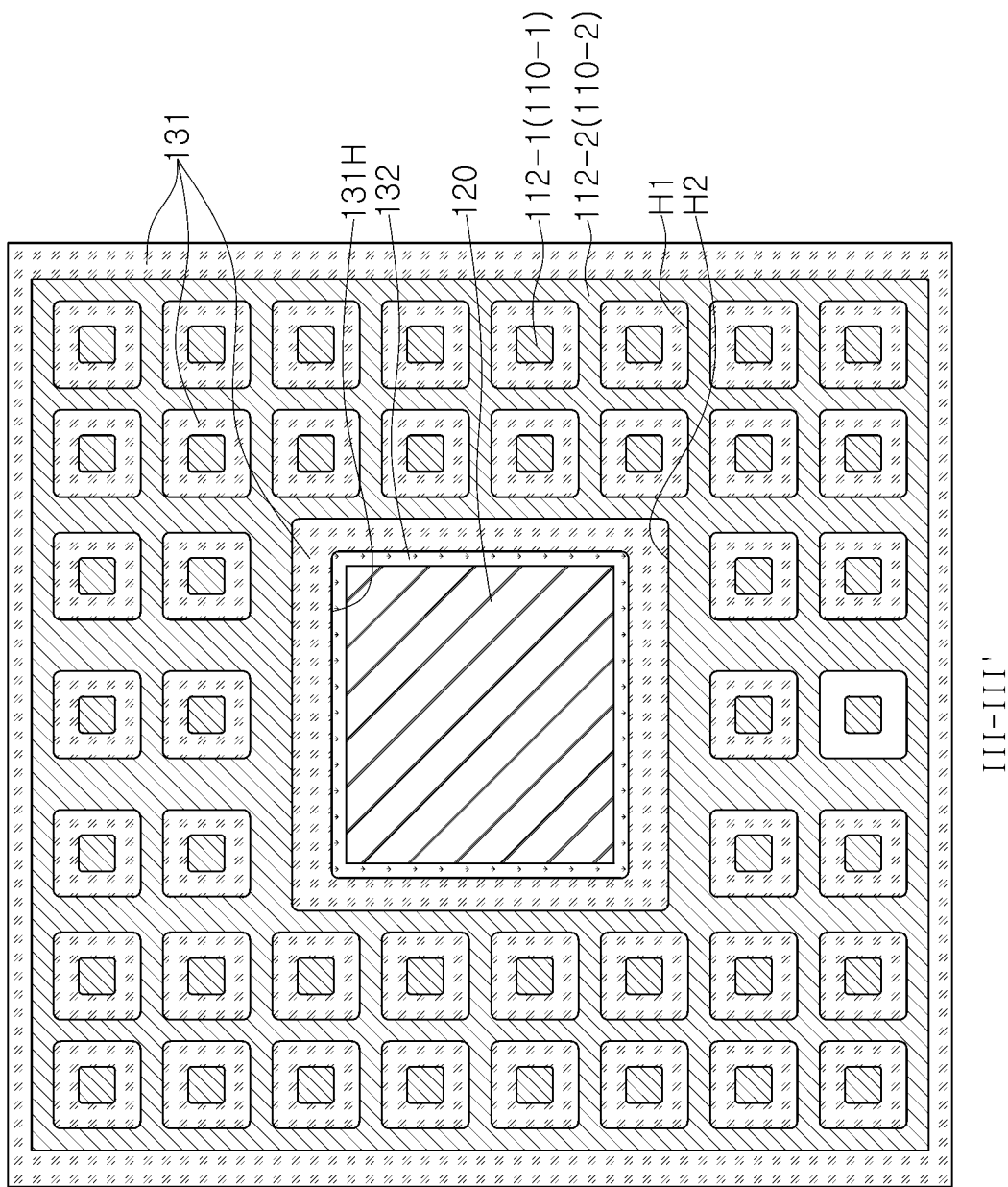
FIG. 7 is a plan view taken along line of the semiconductor package of FIG. 6.

FIG. 6 is a cross-sectional view illustrating a semiconductor package 100B according to an embodiment of the present inventive concept, and FIG. 7 is a plan view taken along line of the semiconductor package 100B of FIG. 6.

Referring to FIGS. 6 and 7, a semiconductor package 100B may further include a core structure 110-2 disposed adjacent to a vertical connection structure 110-1 on a first surface S1 of a first redistribution structure 140. The core structure 110-2 may be spaced apart from a semiconductor chip 120 and the vertical connection structure 110-1. The core structure 110-2 may be electrically insulated from the vertical connection structure 110-1. The core structure 110-2 may surround a lateral surface of the vertical connection structure 110-1 and a lateral surface of the semiconductor chip 120. The core structure 110-2 may include a first through-hole H1 for accommodating or sized to accept the vertical connection structure 110-1, and a second through-hole H2 for accommodating or sized to accept the semiconductor chip 120.

For example, the semiconductor package 100B may include a first redistribution structure 140 including a plurality of pads 140P1-1, 140P1-2, and 140P2, embedded in an upper surface S1, and a first redistribution layer 142 electrically connected to the plurality of pads 140P1-1, 140P1-2, and 140P2, a vertical connection structure 110-1 and a core structure 110-2, electrically connected to the first redistribution layer 142, encapsulants 131 and 132 encapsulating the vertical connection structure 110-1 and the core structure 110-2, and a second redistribution structure. The plurality of pads 140P1-1, 140P1-2, and 140P2 may include pads of a first group (e.g., first pads) 140P1-1 electrically connected to the vertical connection structure 110-1, pads of a second group (e.g., second pads) 140P1-2 electrically connected to the core structure 110-2, and pads of a third group (e.g., third pads) 140P2 electrically connected to the connection electrodes 120P of the semiconductor chip 120.

In an embodiment, the vertical connection structure 110-1 and the core structure 110-2 may include a pillar layer 112 disposed on the pads of a first group 140P1-1 and the second group 140P1-2 and surrounded by the encapsulant 131, and a land layer 111 disposed between the pillar layer 112 and the pads of a first group 140P1-1 and the second group 140P1-2, upper surfaces of the pads of a third group 140P2 may have a step difference from the upper surface S1 of the first redistribution structure 140, and a height of the land layer 111 may be substantially equal to a height of the step difference.

The core structure 110-2 may be electrically connected to a ground pattern 142-2 of the first redistribution layer 142 through a redistribution via 143. The vertical connection structure 110-1 may be electrically connected to a signal/power pattern 142-1 of the first redistribution layer 142 through the redistribution via 143. In a manner similar to the vertical connection structure 110-1, the core structure 110-2 may have various types of vertical/horizontal cross-sectional shapes. Since the core structure 110-2 is formed by the same process as the vertical connection structure 110-1, rigidity characteristics, warpage characteristics, and heat dissipation characteristics of the semiconductor package may be improved while reducing or minimizing additional processes.

Figure 8:
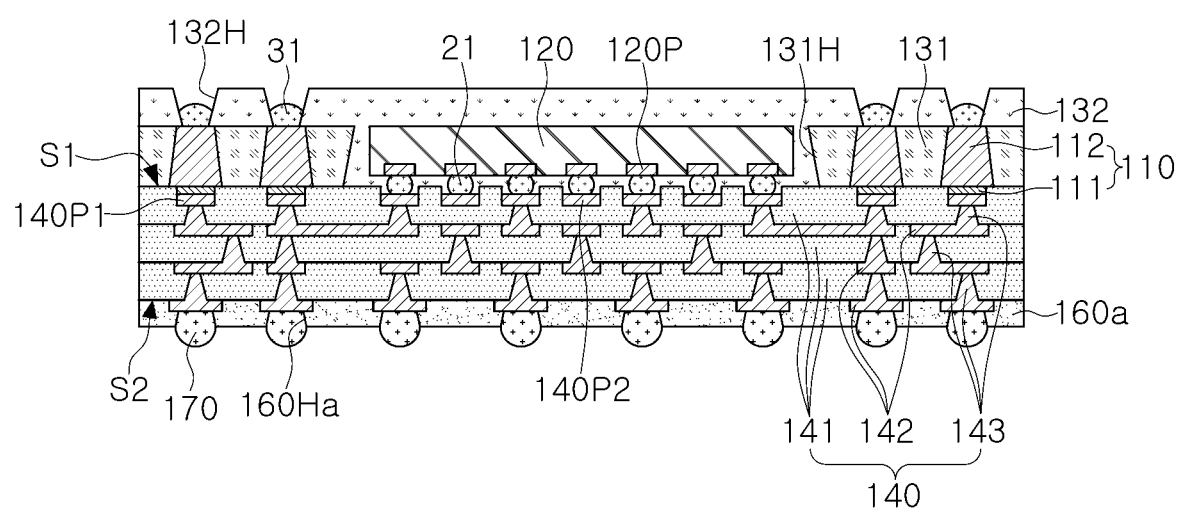
FIG. 8 is a cross-sectional view illustrating a semiconductor package according to an embodiment of the present inventive concept.

FIG. 8 is a cross-sectional view illustrating a semiconductor package 100C according to an embodiment of the present inventive concept.

Referring to FIG. 8, a semiconductor package 100C may further include a connection member 31 disposed on an upper surface of a vertical connection structure 110. In an embodiment, a second encapsulant 132 may have a third opening 132H exposing an upper surface of a pillar layer 112, and the connection member 31 may be disposed in the third opening 132H of the second encapsulant 132. The connection member 31 may include a material, different from the vertical connection structure 110. For example, the connection member 31 may include a solder ball. The connection member 31 may be directly disposed on the upper surface of the pillar layer 112, to reduce a thickness of a package-on-package structure.

Figure 9A:
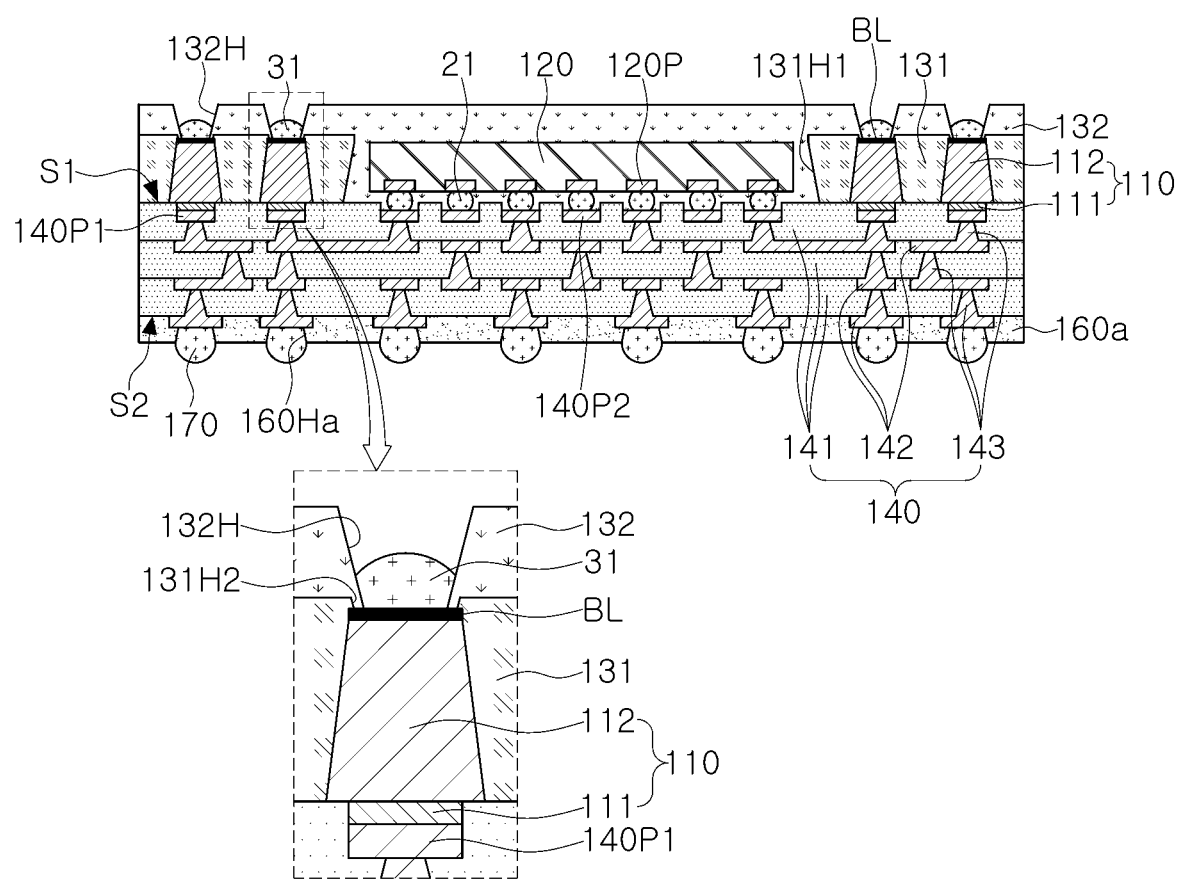
FIG. 9A is a cross-sectional view illustrating a semiconductor package according to an embodiment of the present inventive concept.
Figure 9B:
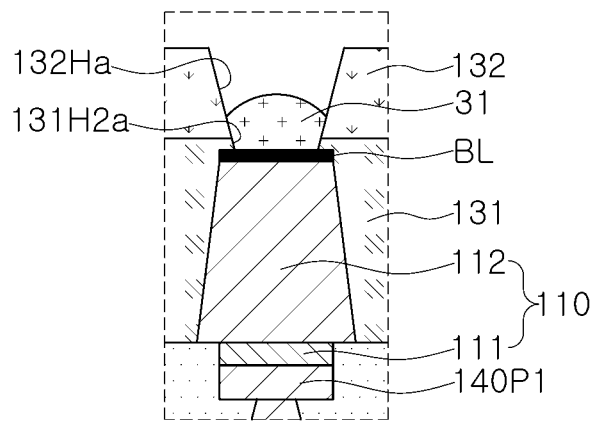
FIG. 9B is a partially enlarged cross-sectional view illustrating a modified example of portion "C" of FIG. 9A.

FIG. 9A is a cross-sectional view illustrating a semiconductor package 100D according to an embodiment of the present inventive concept, and FIG. 9B is a partially enlarged cross-sectional view illustrating a modified example of portion "C" of FIG. 9A.

Referring to FIG. 9A, a semiconductor package 100D may further include a surface layer BL disposed between the pillar layer 112 and the connection member 31, as illustrated in the semiconductor package 100C of FIG. 8. The surface layer BL may be a single or monolithic layer including nickel (Ni) or a multilayer including nickel (Ni) and gold (Au). The surface layer BL may function as a diffusion barrier between the connection member 31 and the pillar layer 112. In an embodiment, a first encapsulant 131 may have a fourth opening 131H2 exposing the surface layer BL. A third opening 132H of a second encapsulant 132 may be formed in the fourth opening 131H2.

Referring to FIG. 9B, in a modified example, in a different manner to FIG. 9A, a third opening 132Ha and a fourth opening 131H2a may be simultaneously formed by the same process. Therefore, a sidewall of the third opening 132Ha and a sidewall of the fourth opening 131H2a may be aligned or connected continuously, i.e., without discontinuities therebetween.

FIGS. 10A to 10E are cross-sectional views schematically illustrating a method of manufacturing the semiconductor package 100D of FIG. 9A.

Figure 10A:
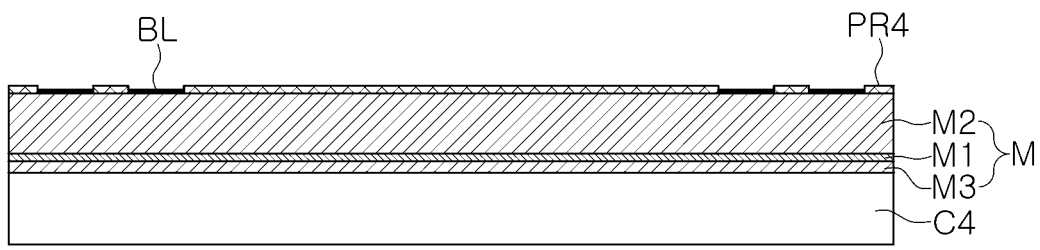
FIGS. 10A to 10E are cross-sectional views schematically illustrating a method of manufacturing the semiconductor package of FIG. 9A.

Referring to FIG. 10A, a metal plate M (e.g., those illustrated in FIG. 5A) may be disposed on a fourth carrier C4, and a plating resist PR4, which has been patterned, may be used to form a surface layer BL on a second metal layer M2. The surface layer BL may be formed by a plating process. The surface layer BL may have a two-layer structure in which nickel and gold are sequentially stacked. Features of the metal plate M may be equal to those described in FIG. 5A, and thus will be omitted.

Figure 10B:
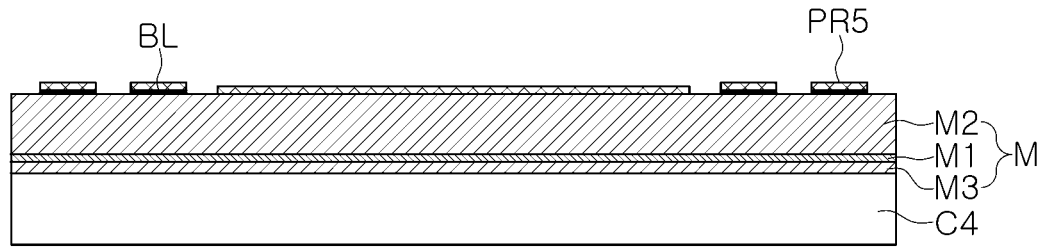

Referring to FIG. 10B, the plating resist PR4 of FIG. 10A may be removed, and a fifth etching resist PR5 may be disposed, in a manner similar to the first etching resist PR1 of FIG. 5B. The fifth etching resist PR5 may cover an upper surface of the surface layer BL.

Figure 10C:
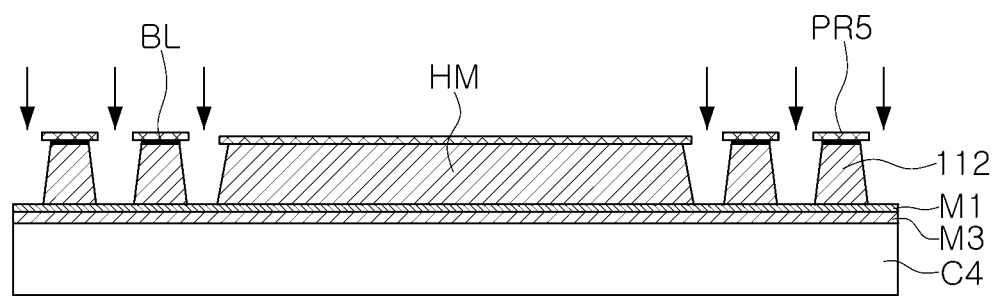

Referring to FIG. 10C, the second metal layer M2 on which the patterned fifth etching resist PR5 is disposed may be etched to form a pillar layer 112 and a cavity layer HM. An etching process for etching the pillar layer 112 and the cavity layer HM may be similar to those described in FIG. 5C, and thus will be omitted.

Figure 10D:
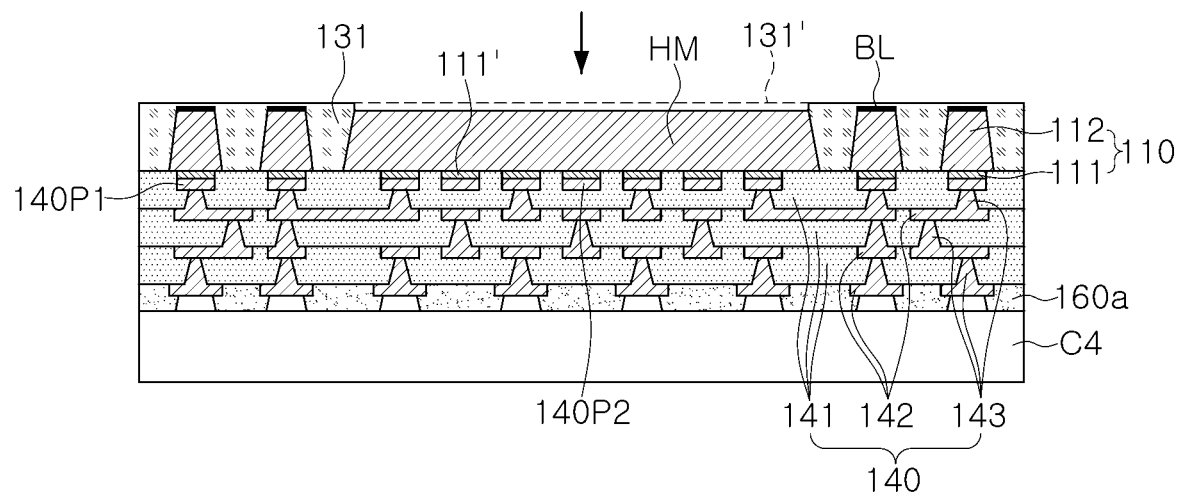

Referring to FIG. 10D, after forming a first encapsulant 131 and a first redistribution structure 140 by the processes of FIGS. 5D to 5F, in a different manner to FIG. 5G, a first encapsulant 131' covering an upper surface of the cavity layer HM may be removed. The first encapsulant 131' on the upper surface of the cavity layer HM may be removed by, for example, a laser drill, but is not limited thereto.

Figure 10E:
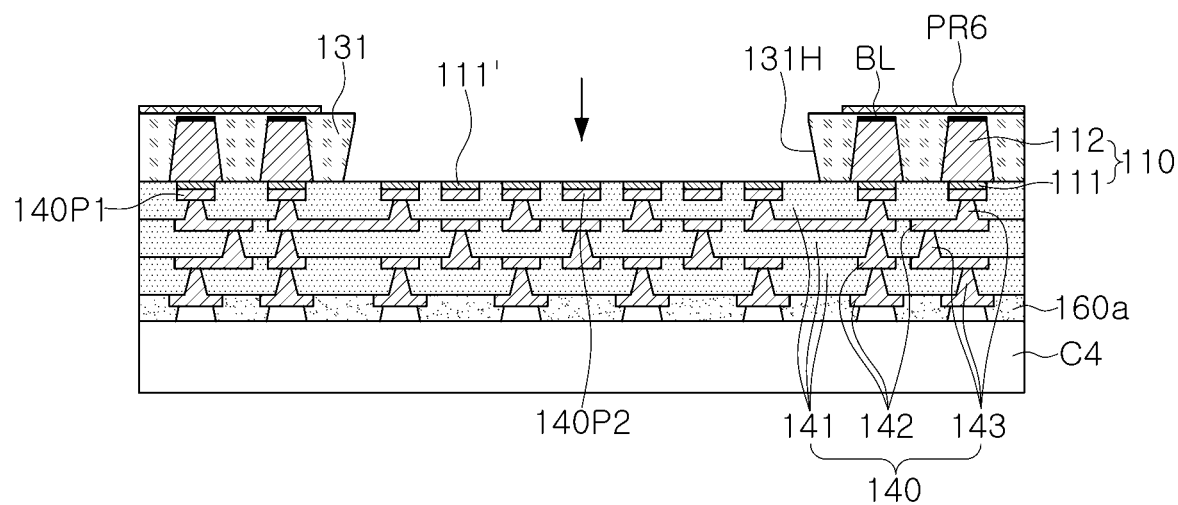

Referring to FIG. 10E, as illustrated in FIG. 5H, the cavity layer HM may be removed using a sixth etching resist PR6. Thereafter, the sixth etching resist PR6 may be removed, and portions of the first encapsulant 131 covering the surface layer BL may be removed. Alternatively, a second encapsulant 132 may be formed, and then portions of the first and second encapsulants 131 and 132 may be simultaneously removed, to form the third opening 132H and the fourth opening 131H2, illustrated in FIGS. 9A and 9B.

Figure 11:
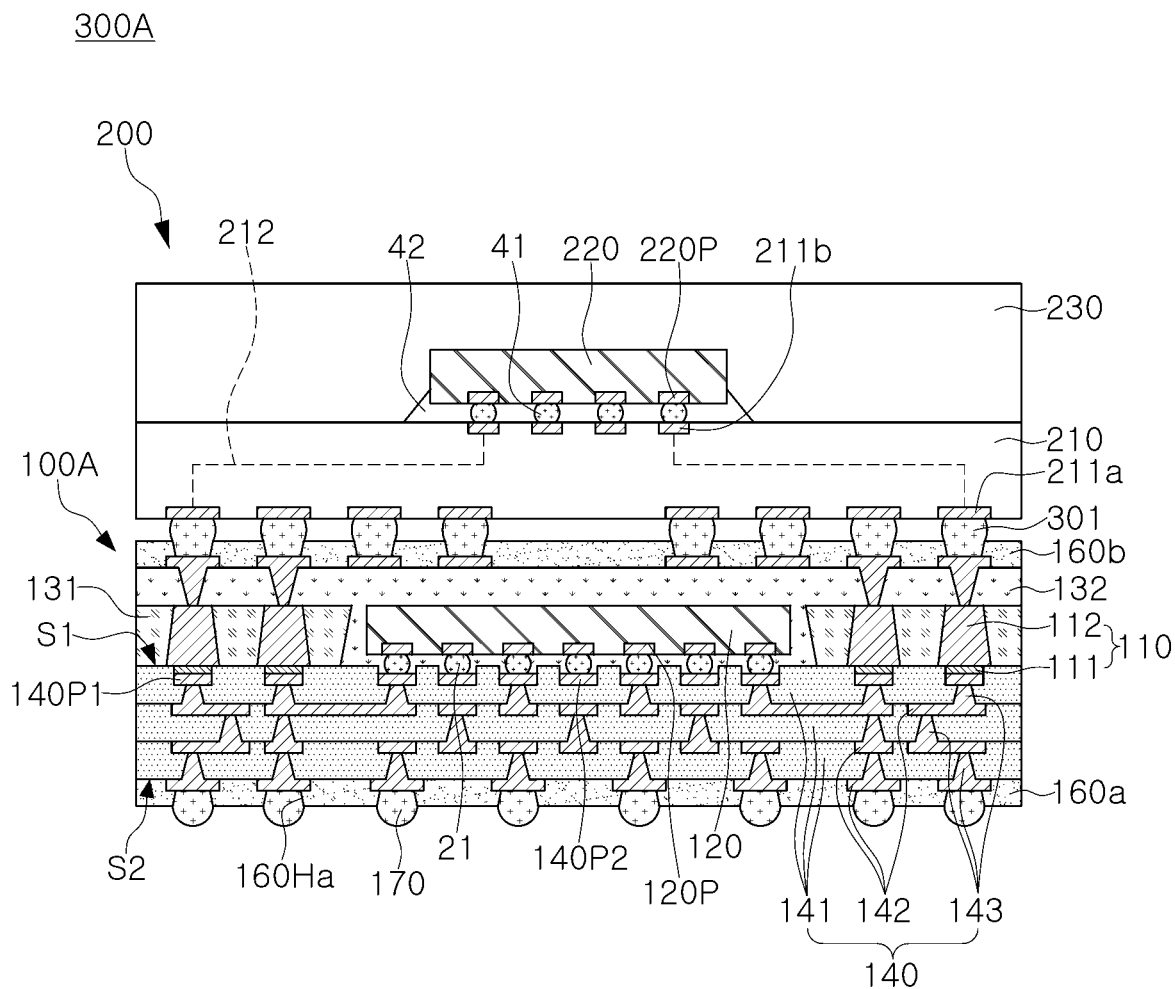
FIG. 11 is a cross-sectional view illustrating a semiconductor package according to an embodiment of the present inventive concept.
Figure 12:
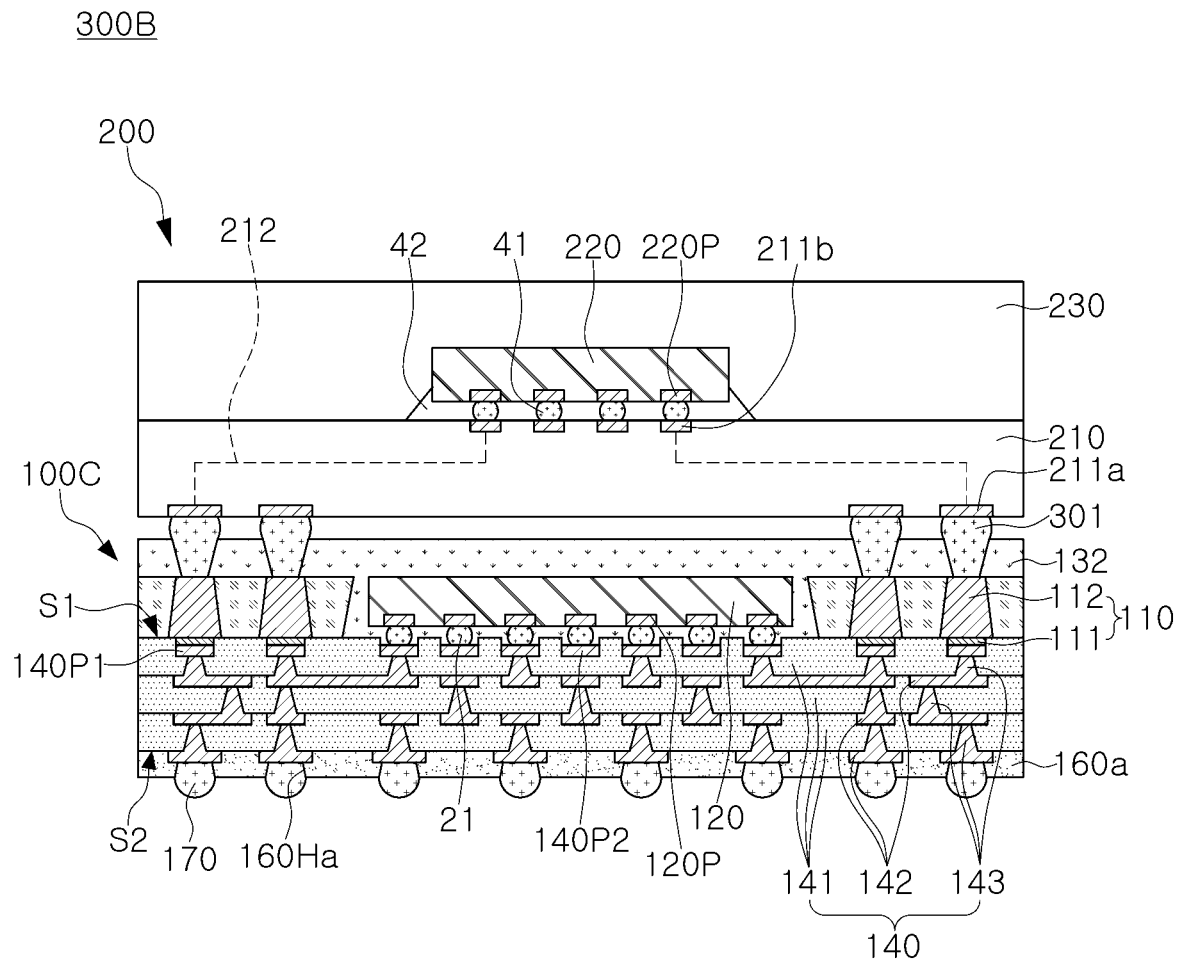
FIG. 12 is a cross-sectional view illustrating a semiconductor package according to an embodiment of the present inventive concept.

FIGS. 11 and 12 are cross-sectional views illustrating semiconductor packages 300A and 300B, respectively, according to an embodiment of the present inventive concept.

Referring to FIG. 11, a semiconductor package 300A may have a package-on-package structure in which a second package 200 is coupled to the first semiconductor package 100A of FIG. 1. The second package 200 may include a second redistribution substrate 210, a second semiconductor chip 220, and a third encapsulant 230.

The second redistribution substrate 210 may include redistribution pads 211a and 211b that may be electrically connected to an external source or device, on lower and upper surfaces of the second redistribution substrate 210, respectively, and may include a redistribution circuit 212 electrically connected to the redistribution pads 211a and 211b therein. The redistribution circuit 212 may redistribute a connection pad 220P of the second semiconductor chip 220 to a fan-out region.

The second semiconductor chip 220 may include a connection pad 220P electrically connected to an integrated circuit therein, and the connection pad 220P may be electrically connected to the second redistribution substrate 210 by a metal bump 41. The metal bump 41 may be surrounded by an underfill material 42. The underfill material 42 may be an insulating material including an epoxy resin or the like. The metal bump 41 may include a solder ball or a copper pillar. In a modified example, the connection pad 220P of the second semiconductor chip 220 may be in direct contact with the upper surface of the second redistribution substrate 210, and may be electrically connected to the redistribution circuit 212 through a via in the second redistribution substrate 210.

The third encapsulant 230 may include a material, identical to or similar to the first encapsulant 131 or the second encapsulant 132 of the first semiconductor package 100A. The second package 200 may be physically and electrically connected to the first semiconductor package 100A by a connection bump 301. The connection bump 301 may be electrically connected to the redistribution circuit 212 in the second redistribution substrate 210 through the redistribution pad 211a on the lower surface of the second redistribution substrate 210. The connection bump 301 may be made of a low melting point metal, for example, tin (Sn) or an alloy containing tin (Sn).

Referring to FIG. 12, in a different manner to the semiconductor package 300A of FIG. 11, a semiconductor package 300B may have a package-on-package structure in which a second package 200 is coupled to the first semiconductor package 100C of FIG. 8. In an embodiment, a connection bump 301 below the second package 200 may be electrically connected to the vertical connection structure 110 through the opening 132H of the second encapsulant 132. In an embodiment, the first semiconductor package 100C and the second package 200 may be coupled without the second redistribution structure 150, and the connection member 31 of the first semiconductor package 100C illustrated in FIG. 8 may be integrated with the connection bump 301 of FIG. 12.

According to embodiments of the present inventive concept, a redistribution structure including a pillar layer may be used to provide a semiconductor package having a reduced or minimized thickness.

While example embodiments have been illustrated and described above, it will be apparent to those skilled in the art that modifications and variations could be made without departing from the scope of the present inventive concept as defined by the appended claims.

What is claimed is:

1. A semiconductor package comprising:
a first redistribution structure having an upper surface comprising a first pad and a second pad therein, and a lower surface opposite the upper surface and comprising a first redistribution layer electrically connected to the first pad and the second pad;
a vertical connection structure on the first pad of the first redistribution structure and comprising a land layer on the first pad, and a pillar layer on the land layer, the pillar layer having a lateral surface tapered in a first direction;
a semiconductor chip on the second pad of the first redistribution structure;
a first encapsulant on the upper surface of the first redistribution structure and covering the vertical connection structure, the first encapsulant having a lateral surface defining a cavity in which the semiconductor chip disposed and tapered in the first direction;
a second encapsulant on the first encapsulant and in the cavity; and
a first connection bump on the lower surface of the first redistribution structure and electrically connected to the first redistribution layer.

2. The semiconductor package as claimed in claim 1, wherein the lateral surface of the vertical connection structure is tapered such that a width of the pillar layer increases toward the upper surface of the first redistribution structure.

3. The semiconductor package as claimed in claim 1, wherein the lateral surface of the first encapsulant is tapered such that a width of the cavity increases toward the upper surface of the first redistribution structure.

4. The semiconductor package as claimed in claim 1, wherein the first pad and the second pad are below the upper surface of the first redistribution structure.

5. The semiconductor package as claimed in claim 1, wherein the land layer is below the upper surface of the first redistribution structure.

6. The semiconductor package as claimed in claim 1, wherein a thickness of the first pad is greater than a thickness of the land layer of the vertical connection structure.

7. The semiconductor package as claimed in claim 1, further comprising:
a second redistribution structure on the second encapsulant,
wherein the second redistribution structure comprises a second redistribution layer on the second encapsulant, and a second redistribution via extended from the second redistribution layer to the vertical connection structure.

8. The semiconductor package as claimed in claim 7, wherein at least a portion of the second encapsulant covers an upper surface of the vertical connection structure, and the second redistribution via penetrates through the at least a portion of the second encapsulant to electrically connect the second redistribution layer and the vertical connection structure.

9. The semiconductor package as claimed in claim 1, further comprising:
a second connection bump between the semiconductor chip and the first redistribution structure, wherein the second connection bump electrically connects a connection electrode of the semiconductor chip and the second pad of the first redistribution structure.

10. A semiconductor package comprising:
a redistribution structure comprising an insulating layer, and first and second pads in the insulating layer;
a vertical connection structure on the redistribution structure, and electrically connected to the first pad;
a semiconductor chip on the redistribution structure and including a connection electrode electrically connected to the second pad; and
an encapsulant on the semiconductor chip and the vertical connection structure,
wherein the vertical connection structure comprises a land layer in the insulating layer and contacting the first pad, and a pillar layer on the land layer, and
wherein an upper surface of the first pad and an upper surface of the second pad are recessed, relative to an upper surface of the insulating layer.

11. The semiconductor package as claimed in claim 10, wherein an upper surface of the land layer is substantially coplanar with the upper surface of the insulating layer.

12. The semiconductor package as claimed in claim 10, wherein at least a portion of a lower surface of the pillar layer is in contact with the upper surface of the insulating layer.

13. The semiconductor package as claimed in claim 10, wherein the land layer comprises a material having etch selectivity with respect to the first and second pads.

14. The semiconductor package as claimed in claim 10, wherein a distance from the upper surface of the insulating layer to the upper surface of the first pad substantially equal to a distance from the upper surface of the insulating layer to the upper surface of the second pad.

15. A semiconductor package comprising:
a redistribution structure comprising an insulating layer, and first and second pads in the insulating layer;
a vertical connection structure on the redistribution structure, and electrically connected to the first pad;
a semiconductor chip on the redistribution structure and including a connection electrode electrically connected to the second pad; and
an encapsulant on the semiconductor chip and the vertical connection structure,
wherein the vertical connection structure comprises a land layer in the insulating layer and contacting the first pad, and a pillar layer on the land layer,
wherein the insulating layer has a first recess exposing the first pad, and a second recess exposing the second pad, and
wherein the land layer is disposed in the first recess.

16. The semiconductor package as claimed in claim 15, wherein the first pad and the second pad are on a same level relative to a surface of the insulating layer.

17. The semiconductor package as claimed in claim 15, wherein an upper surface of the first pad and an upper surface of the second pad have a step difference from an upper surface of the insulating layer.

18. The semiconductor package as claimed in claim 17, wherein a thickness of the land layer is substantially equal to a height of the step difference.

19. The semiconductor package as claimed in claim 15, wherein a width of the pillar layer increases in a direction toward the land layer.

20. The semiconductor package as claimed in claim 15, wherein a width of the pillar layer is greater than each of a width of the land layer, a width of the first pad, and a width of the second pad.

* * * * *